United States Patent [19]

Kurosawa et al.

[11] Patent Number: 5,603,015
[45] Date of Patent: Feb. 11, 1997

[54] LOGIC SIMULATION APPARATUS FOR EXECUTING SIMULATION OF A CIRCUIT

[75] Inventors: Yuuichi Kurosawa; Takahisa Kaihotsu, both of Tokyo; Hiroshi Sakai, Yokohama, all of Japan

[73] Assignee: Kabushiki Kaisha Toshiba, Kawasaki, Japan

[21] Appl. No.: 565,213

[22] Filed: Nov. 30, 1995

Related U.S. Application Data

[63] Continuation of Ser. No. 254,619, Jun. 6, 1994, abandoned.

[30] Foreign Application Priority Data

Jun. 7, 1993 [JP] Japan ..................... 5-136123

[51] Int. Cl.⁶ ........................................ G06F 13/24
[52] U.S. Cl. .................. 395/500; 364/488; 364/578; 364/DIG. 1; 364/DIG. 2
[58] Field of Search ..................... 395/500; 364/488, 364/578

[56] References Cited

U.S. PATENT DOCUMENTS

| | | | |
|---|---|---|---|
| 5,051,938 | 9/1991 | Hyduke | 364/578 |
| 5,068,812 | 11/1991 | Schaefer et al. | 364/578 |
| 5,081,601 | 1/1992 | Eirikasson | 364/578 |
| 5,105,373 | 4/1992 | Rumsey et al. | 364/578 |
| 5,155,832 | 10/1992 | Hunt | 395/425 |
| 5,220,512 | 6/1993 | Watkins et al. | 364/578 |

FOREIGN PATENT DOCUMENTS

| | | |
|---|---|---|
| 4-44174 | 2/1992 | Japan . |
| 4-78960 | 3/1992 | Japan . |

*Primary Examiner*—Robert B. Harrell
*Assistant Examiner*—Zarni Maung
*Attorney, Agent, or Firm*—Finnegan, Henderson, Farabow, Garrett & Dunner, L.L.P.

[57] ABSTRACT

A logic simulation apparatus for executing simulation of the designed logic circuit includes first storing means for storing only constant information whose contents do not change during the simulation, second storing means for storing information except information stored in the first storing means, generating means for generating predetermined information in a predetermined format into the first and second storing means on the basis of circuit information of the logic circuit, and simulation executing means for executing simulation of function of the logic circuit as a whole using the information.

14 Claims, 25 Drawing Sheets

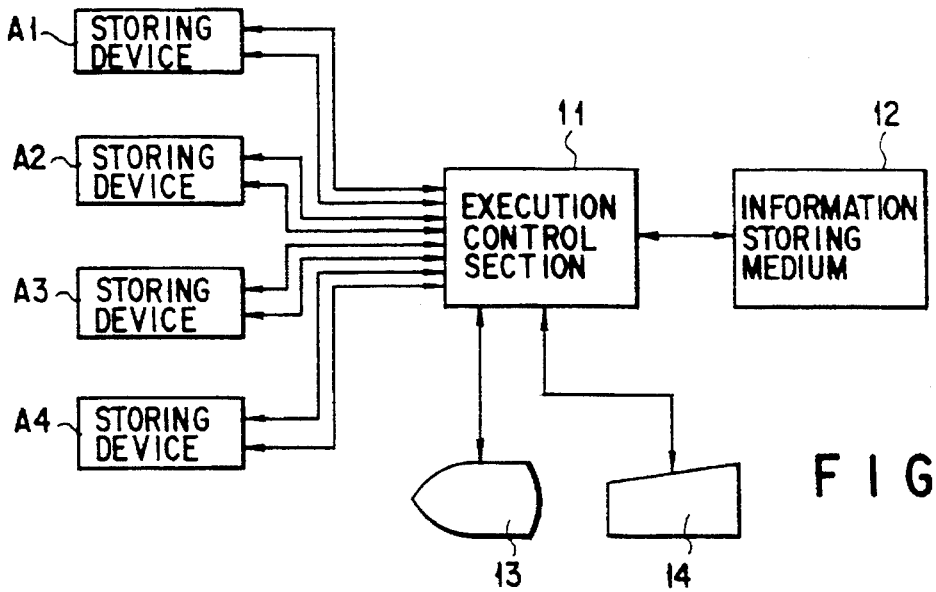
F I G. 3
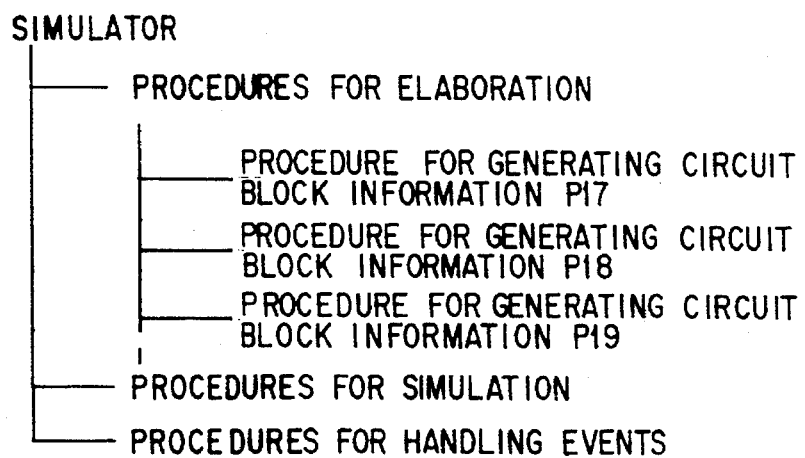
F I G. 5
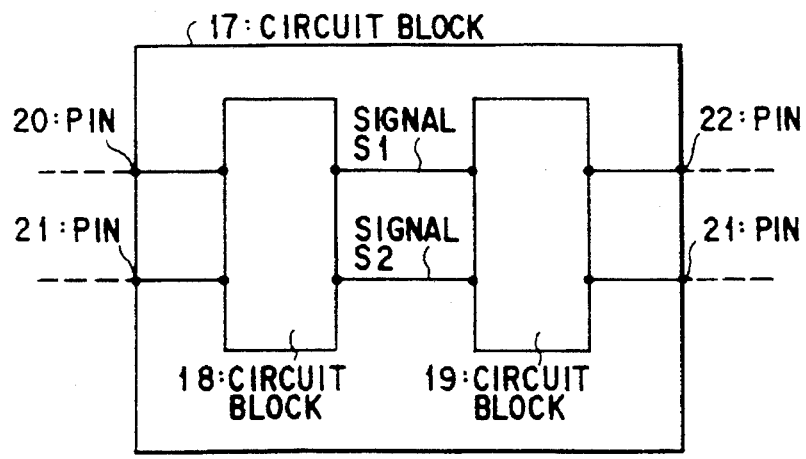
F I G. 6

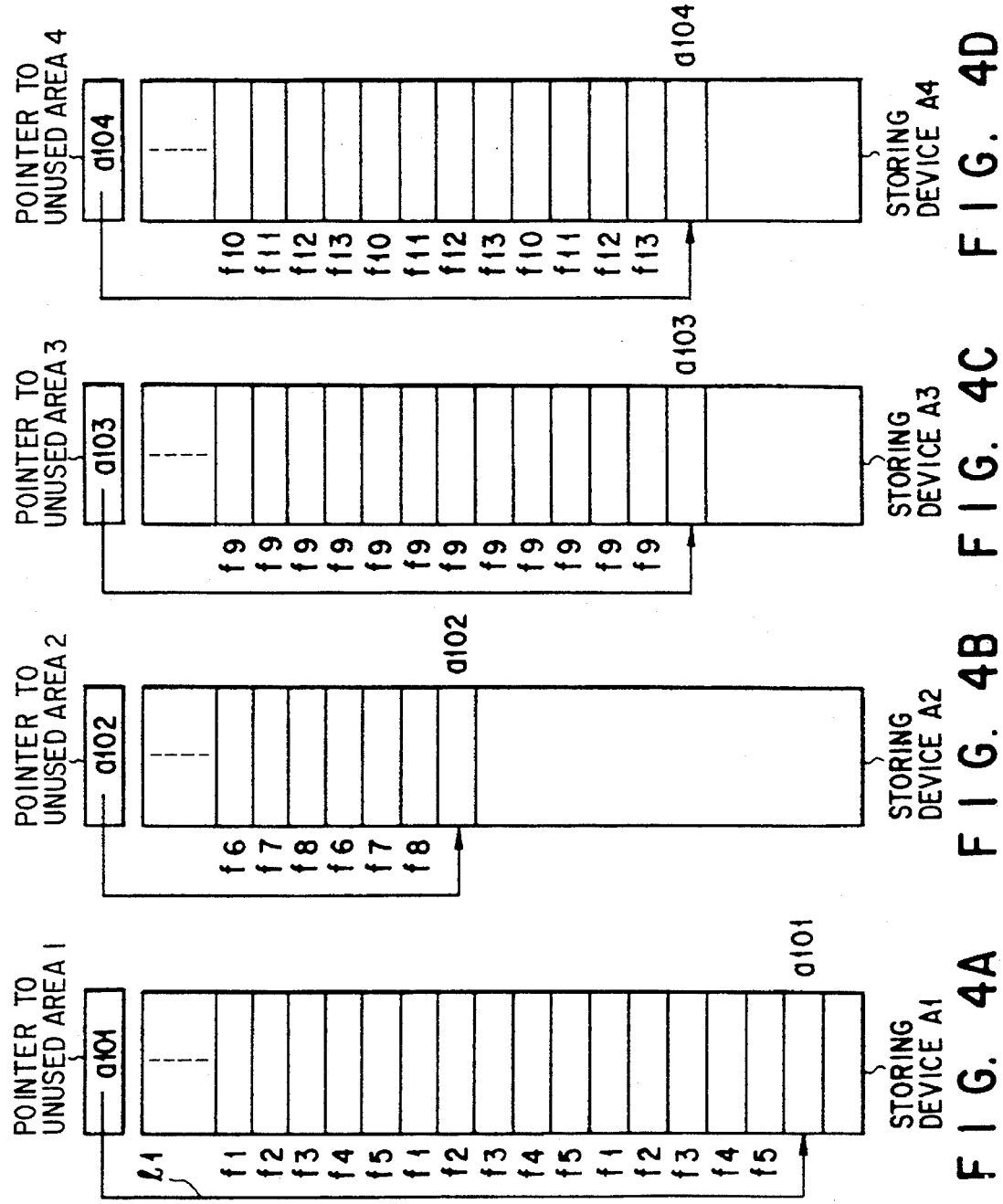

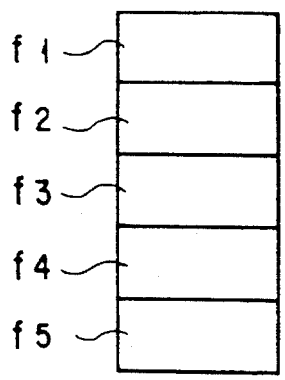

- f1 — POINTER INDICATING UPPER-LEVEL CIRCUIT BLOCK INFORMATION
- f2 — POINTER INDICATING LOWER-LEVEL CIRCUIT BLOCK INFORMATION
- f3 — POINTER INDICATING THE SAME LEVEL CIRCUIT BLOCK INFORMATION
- f4 — POINTER INDICATING FIRST SIGNAL INFORMATION
- f5 — POINTER INDICATING FIRST PIN INFORMATION

F I G. 7

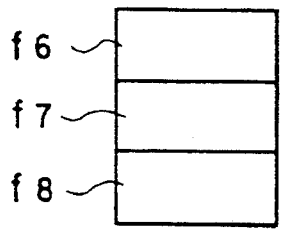

- f6 — CURRENT SIGNAL VALUE
- f7 — TIME AT WHICH SIGNAL VALUE CHANGES TO THE CURRENT SIGNAL VALUE
- f8 — KIND OF OPERATION TO BE EXECUTED WHEN A SIGNAL VALUE CHANGES

F I G. 8

- f9 — POINTER INDICATING CONNECTED SIGNAL

F I G. 9

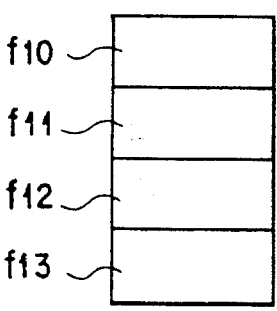

- f10 — POINTER INDICATING SIGNAL INFORMATION TO BE ASSIGNED
- f11 — VALUE TO ASSIGNED
- f12 — TIME AT WHICH ASSIGNMENT OCCURS
- f13 — POINTER INDICATING ANOTHER EVENT OF THAT TIME

F I G. 10

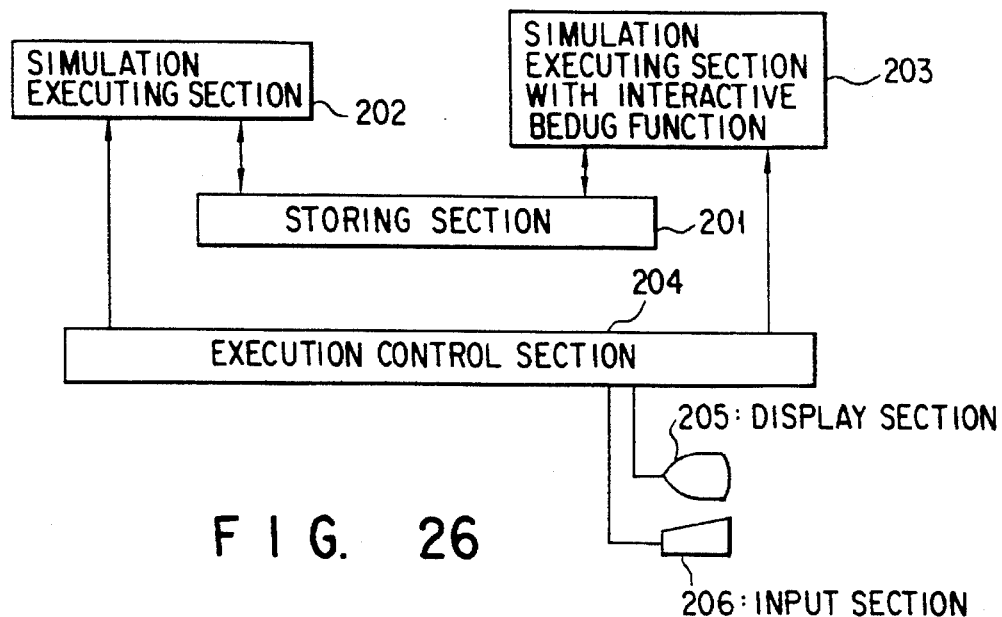
F I G. 26
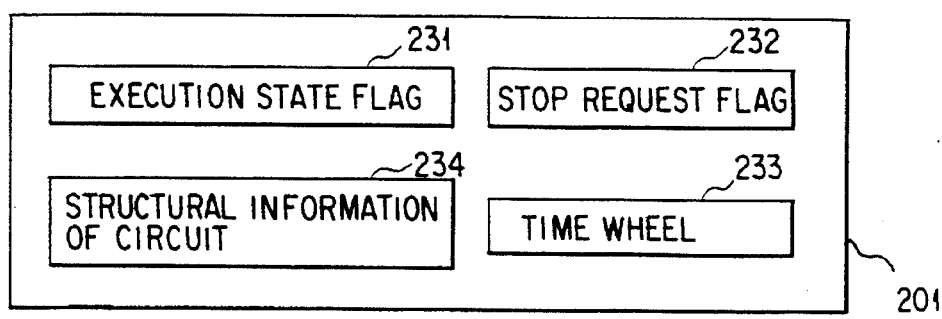
F I G. 27
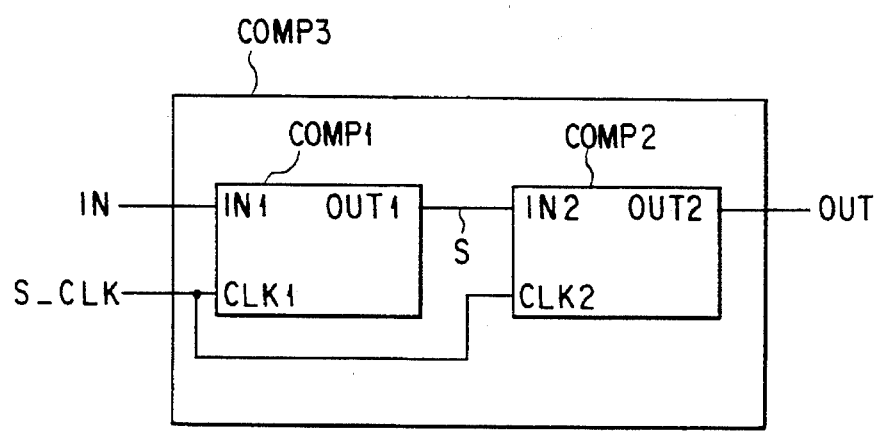
F I G. 28

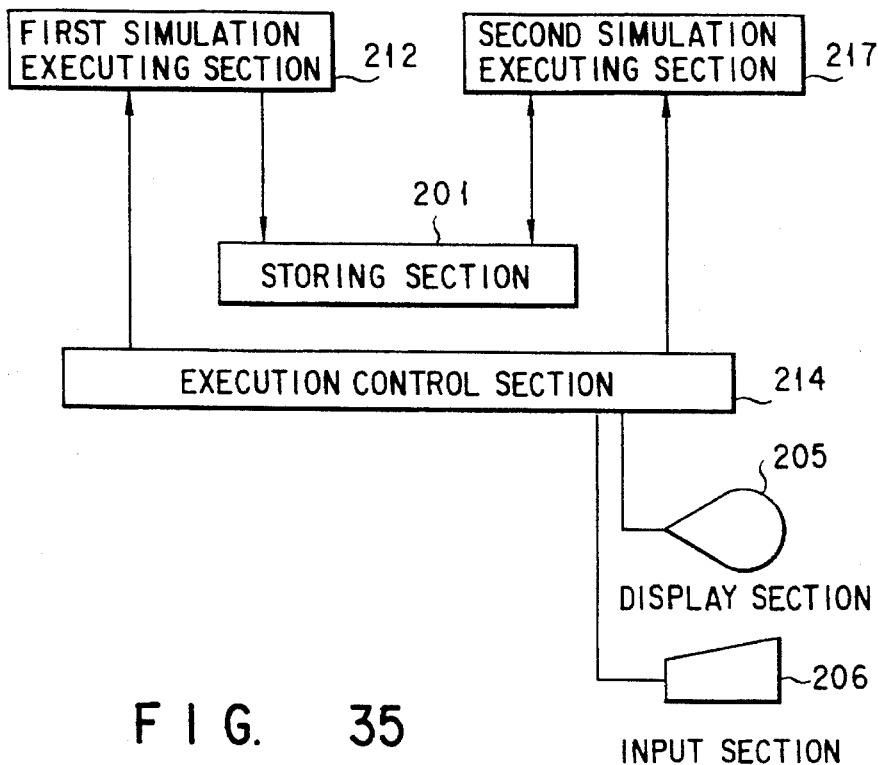
F I G. 35
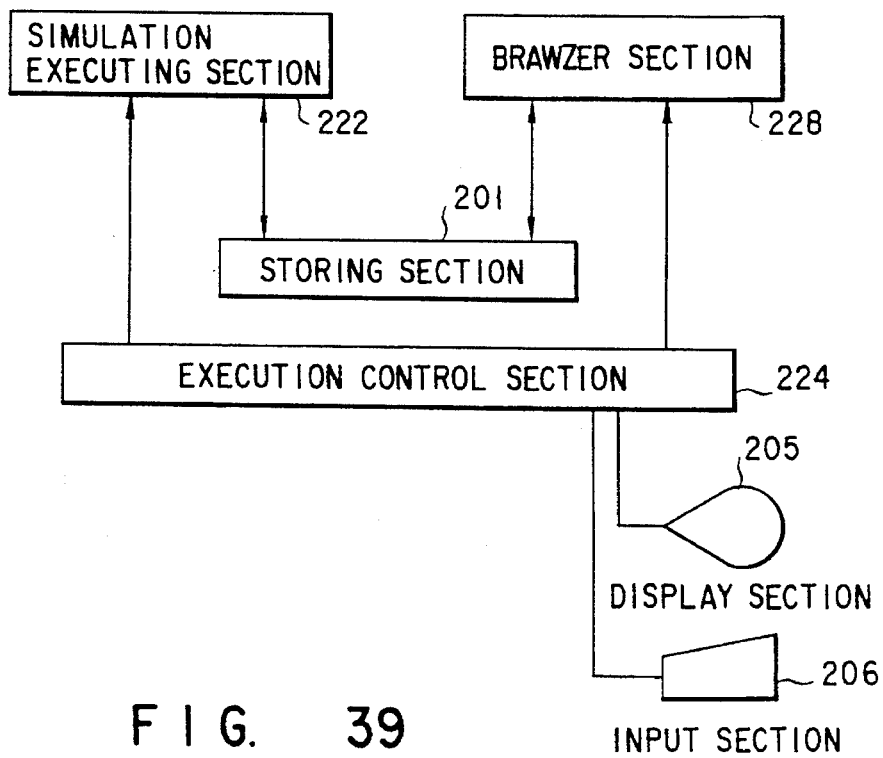
F I G. 39

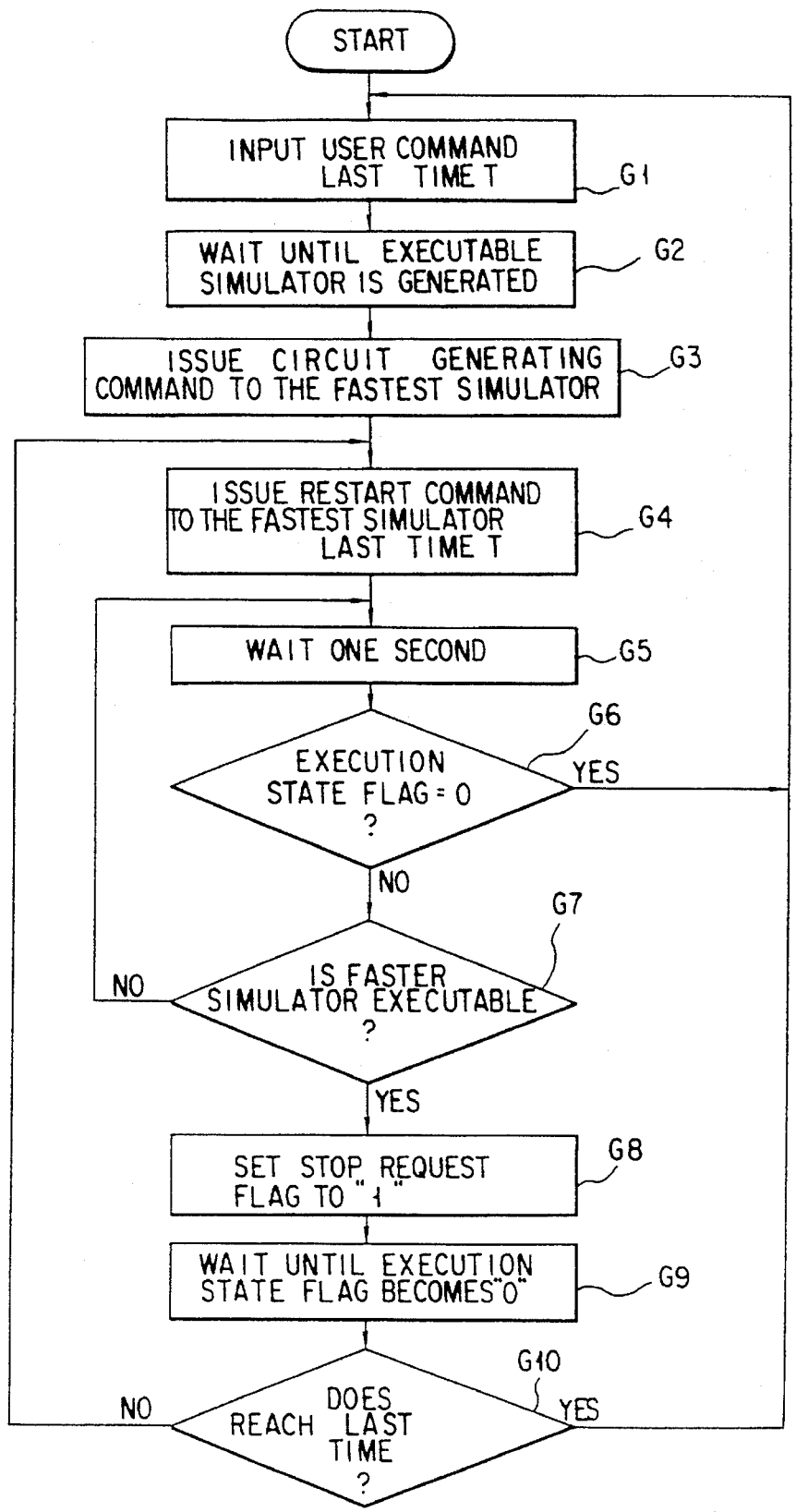
F I G. 36

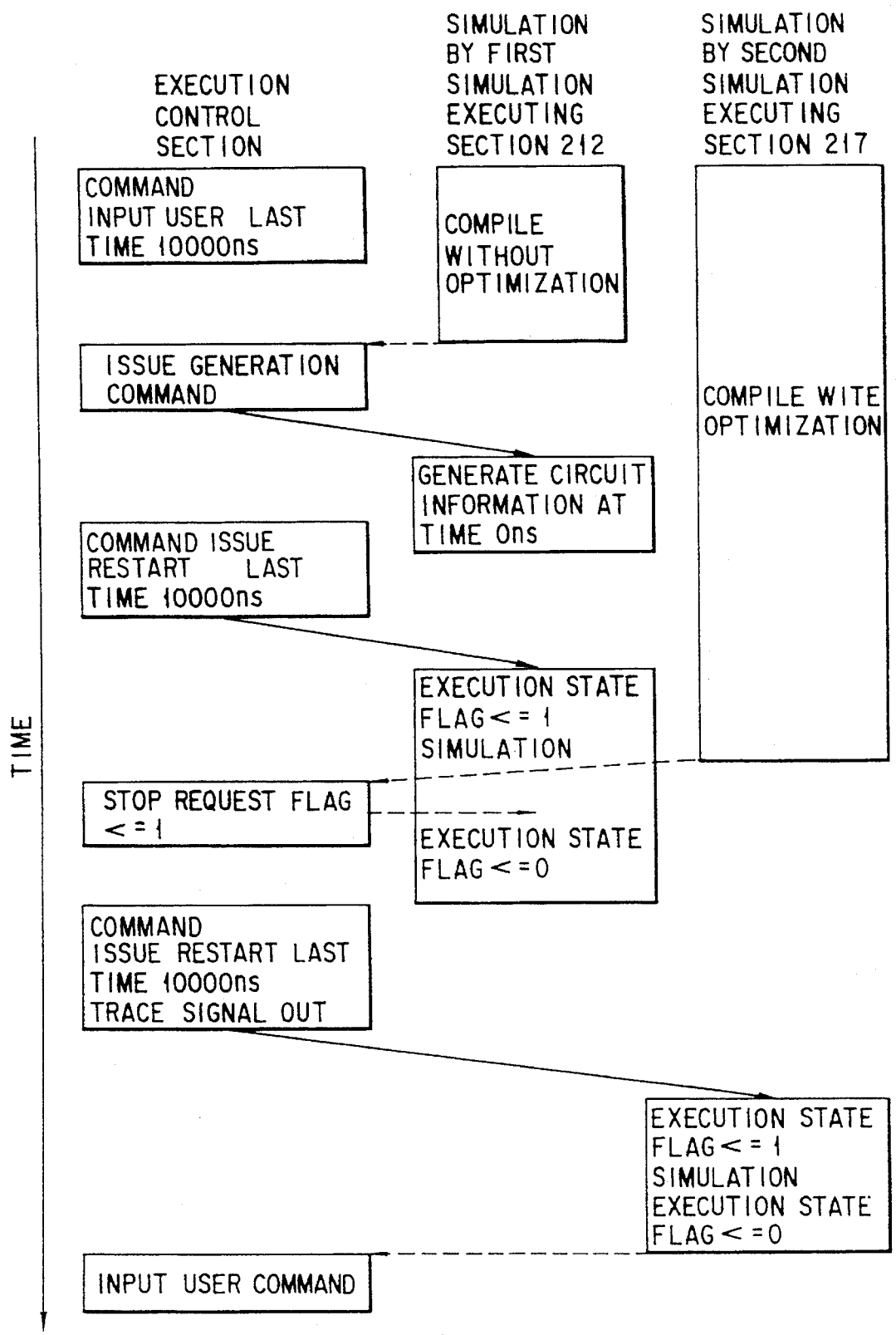
F I G. 37

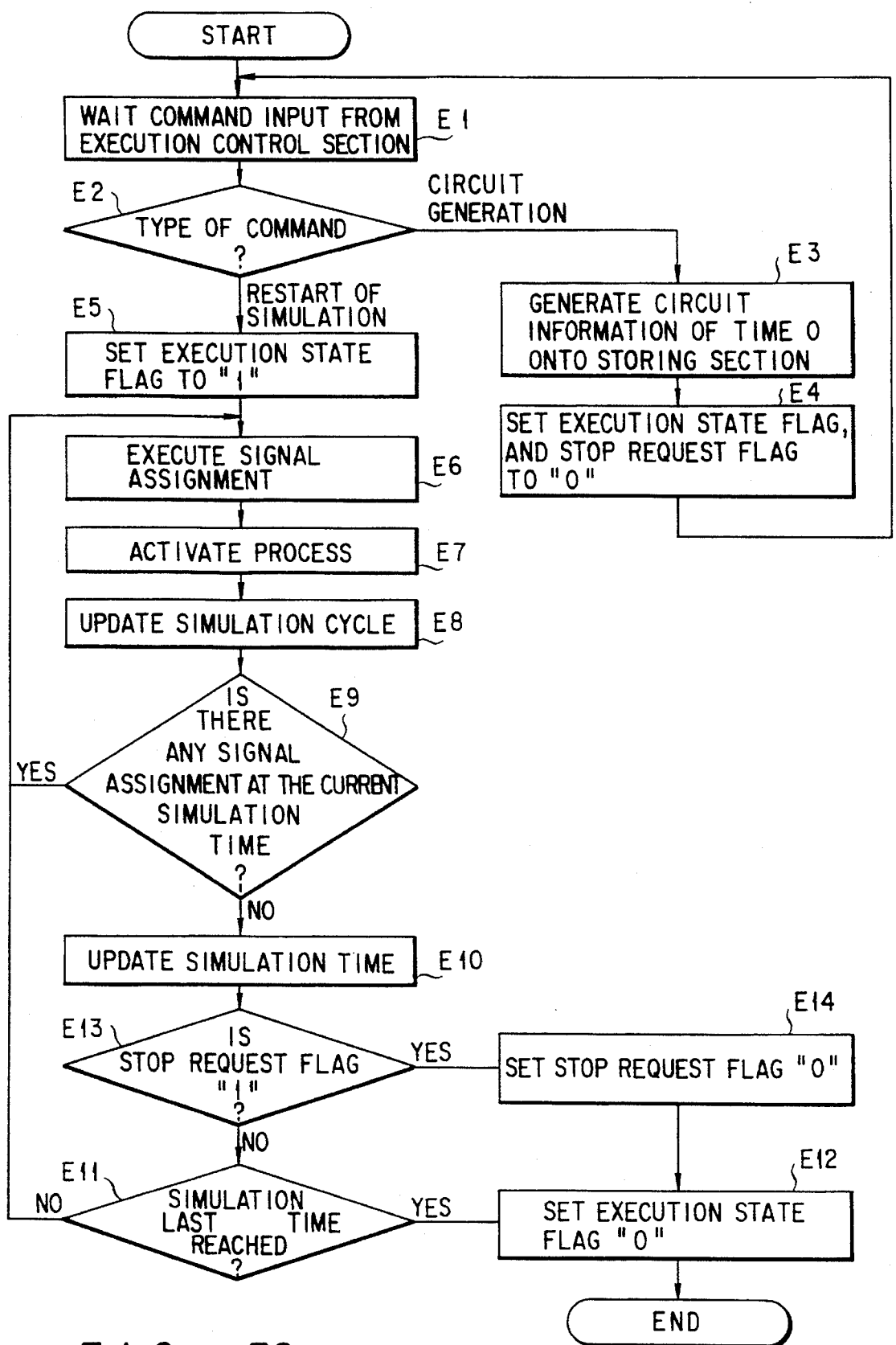
F I G. 38

LOGIC SIMULATION APPARATUS FOR EXECUTING SIMULATION OF A CIRCUIT

This application is a continuation of application Ser. No. 08/254,619, filed Jun. 6, 1994, now abandoned.

BACKGROUND OF THE INVENTION

1. Field of the Invention

The present invention relates to a logic simulation apparatus.

2. Description of the Related Art

In recent years, with an increase in scale of an LSI and complications thereof, various CAD systems have been utilized in the designing process of LSI. In an architecture design or a logic circuit design, a designer often describes the internal structure or operation of a circuit module using a hardware description language. As the hardware description language, VHDL or the like is a typical example. In order to verify that the description of a circuit is correct, simulation is frequently performed using a logic simulation apparatus to check whether an expected result is obtained. As this logic simulation apparatus, a batch simulator for executing simulation at a high speed up to designated or specified time or an interactive simulator which has a speed lower than that of the batch simulator but is convenient to debug is known.

The logic simulation apparatus executes simulation program to perform simulation. The simulation program mainly has procedures for elaboration, procedures for simulation, and procedures for handling events (FIG. 1). As other procedures executed on the logic simulation apparatus, various procedures such as a procedure for check point, a procedure for a page-in/page-out, and a procedure for user interface are known.

Means for verifying a circuit by simulation using the logic simulation apparatus is very effective. However, a considerably long time is required for executing the simulation. This is a large factor for preventing from shortening a design time.

As the reason why the simulation is executed at a low speed, the low speed of check point process is known. In the check point process, a circuit state (data indicating the circuit state) in the execution process of the simulation is stored in a disk apparatus or the like at a predetermined timing, and the simulation is restarted from the stored state. The check point process is effective in the following cases.

(i) During simulation whose execution requires several days, even if the latest state of the simulation is lost due to a power failure or breakdown of an apparatus, the simulation from the beginning need not be restarted.

(ii) Even if a circuit state becomes in a different state from an expected value during execution of simulation, a state obtained immediately before the circuit is set in this state can be rapidly reproduced to specify an erroneous portion of a circuit design.

(iii) In various tests performed to a circuit subjected to simulation from the desired intermediate state, the desired intermediate state is saved by the check point process, so that the simulation again from an initial state to the intermediate state can be omitted in each test.

In order to execute simulation of the circuit described above by VHDL or the like, the entire structure of the circuit subjected to simulation is constituted by a partial circuit (i.e., a circuit module) described by the VHDL. This process is called elaboration process. A conventional elaboration process is performed as follows.

With respect to circuit modules corresponding to an entire circuit subjected to simulation, signals defined in the circuit modules, data representing registers, pointer information indicating lower-level circuit modules, and the like are stored in a storing device. The same processes as described above are performed to the lower-level circuit modules of the circuit modules. When the hierarchy of a circuit description is developed from upper-level circuit modules to lower-level circuit modules by the same sequence as described above, data areas corresponding to the circuit modules are sequentially allocated in the storing device.

According to a conventional logic simulation apparatus, as a result of the elaboration process, as shown in FIG. 2, when the entire circuit is divided into a plurality of circuit blocks, information relating to one circuit block is stored in adjacent areas in the storing device, and pieces of information of circuit blocks l, m, and n having a close relationship (e.g., upper-level, lower-level, and same-level) in a hierarchical structure are stored adjacent areas.

As check point process of information relating to a conventional circuit block, a process for saving entire data of a circuit subjected to the simulation as shown in FIG. 2, or a process for searching and saving only variable data which changes depending on a signal or simulation time of a register while modules are sequentially traced is performed. In the former, since the amount of data to be saved becomes very large, not only check point process requires a long time, but also a storing capacity required for saving the data disadvantageously increases. Although the latter is often used to save the storing capacity, in this case, the process speed of simulation decreases because a long time is required for performing search process of a data portion which must be saved.

As another reason why simulation is executed at a low speed, a page-out process requires a long time. The page-out process is a process for temporarily paging out part of the storing device which is in use to a magnetic disk device or the like using one page as a unit so as to execute, e.g., another job having a high priority. In this page-out process, when a page to which a page-out process has been performed is not updated after a previous page-out process is required, if a page-out process is performed, the contents of the page need not be written in the disk device again because the same data as that of the page to which page-out process has been performed is saved in the disk device. In a conventional elaboration, since pieces of information which change during the execution process of simulation are distributed as described above, a page to which a page-out process has been performed is updated at a very high probability after the previous page-out process is performed, and the contents of the page must be frequently written in the disk device. For this reason, the speed of the page-out process decreases, thereby delaying execution of the simulation.

With respect to simulation, in addition to high-speed processing, another serious problem is posed. In a conventional simulator, since data representing the state of a circuit has a large capacity of several Mbytes, pointer information used as the above circuit information requires data having a capacity of about 4 bytes. For this reason, a total storing capacity required for all pointers disadvantageously becomes very large.

As described above, as the logic simulation apparatus, a batch simulator for executing simulation at a high speed up to designated time or an interactive simulator which has a speed slightly lower than that of the batch simulator but is convenient to debug is known.

When circuit is to be verified, simulation is executed up to time T, and debugging is performed from time T. As a method of performing the debugging, the following two methods are known. The first method is a method in which an interactive simulator is used from the beginning. However, the first method has a problem that a long time is required to execute the simulation up to time T. The second method is as follows. That is, simulation is executed by the batch simulator up to time T, a circuit state (data indicating this) obtained at time T stored inside the simulator is dumped in a file, an interactive simulator is activated, and the file is loaded, thereby restarting the simulation. According to this method, a long time is required for reading and writing data from/in the file.

With respect to simulation program, trade-off is established between simulation speed and a time from when a circuit description is changed to when simulation is started. For example, in compiled simulator, when the simulator is complied without optimization, the compile time tends to be short but the simulation speed tends to be low. However, when it is compiled with optimization, the time tends to be long but the simulation speed tends to be high. In general, when simulation is started again from the beginning by changing the circuit description, an error may occur immediately after the simulation is started, or an error may occur after the simulation is executed for a considerably long time. For this reason, time at which an error occurs for the first time after the simulation is started is not always recognized before the simulation is started. Therefore, it cannot be correctly determined whether the simulator having a short time required for starting the simulation or the simulator having high simulation speed must be selected to reach time at which an error occurs for the first time.

During simulation, as debugging means, for example, showing the circuit state such as the structure of the circuit or the signal value to display means or the like is used. This function is conventionally realized by two methods. The first method is a method of installing a procedure for displaying the state in the simulator. According to this method, since the procedure is always set even when the procedure is not necessary, a program size disadvantageously increases. The second method is a method of developing a display program to transfer data to the display program through a file. According to this method, since a long time is required for reading/writing data from/in the file, a time from when a display operation is requested by a user to when the data is actually displayed is disadvantageously long.

As described above, in a conventional logic simulation apparatus, since a long time is required for check point process and a page-out process, these processes make the simulation speed low. In addition, the conventional simulation apparatus disadvantageously requires a large information amount for each pointer.

In the conventional logic simulation apparatus, an interactive simulator itself has a low simulation speed. In a method of simulation such that a batch simulator is switched to an interactive simulator during the simulation to increase the simulation speed, a long time is disadvantageously required for switching the batch simulator to the interactive simulator.

In the conventional logic simulation apparatus, simulation speed is low when a required time from when the circuit description changes to when the simulation is started, and the simulation speed is high when the required time is long. A simulator having the shortest time required for detecting an error is not always selected.

In addition, according to the conventional logic simulation apparatus, in a method of displaying a circuit state, an excellent response cannot be easily realized by using a small memory amount because trade-off is established between the required memory amount and the response to a request from a user.

SUMMARY OF THE INVENTION

It is an object of the present invention to provide an improved logic simulation apparatus.

More specifically, the objects of the present invention are to provide the following logic simulation apparatuses.

It is the first object of the present invention to provide a logic simulation apparatus in which circuit information described using a hardware description language is used as an input and simulation is executed on the basis of the circuit information, wherein simulation speed is increased to reduce a storing area required for the simulation.

It is the second object of the present invention to provide a logic simulation apparatus having higher simulation speed.

A logic simulation apparatus for executing simulation of a designed logic circuit according to a first aspect of the invention is characterized by comprising first storing means for storing only constant information whose contents do not change during the simulation; second storing means for storing information except information stored in the first storing means; generating means for generating predetermined information in a predetermined format into the first and second storing means on the basis of circuit information of the logic circuit; and simulation executing means for executing simulation of function of the logic circuit as a whole using the information.

The second storing means includes means for storing only variable information which changes during the simulation or includes means for storing information which changes and information which does not change, during the simulation.

The information includes one required for simulation relating to a plurality of circuit blocks and signals constituting an entire circuit subjected to the simulation.

The apparatus according to the first aspect is characterized by further comprising storing means including at least the first and second storing means, or save storing means for check point process, saving means for saving the variable information in the save storing means, loading means for rewriting the variable information saved in the save storing means in the same area as that in which the variable information was stored before it is saved.

A logic simulation apparatus for executing simulation of a designed logic circuit according to the first aspect of the present invention is further characterized by comprising: first storing means for storing only constant information whose contents do not change during the simulation; second storing means for storing information except information stored in the first storing means; generating means for generating predetermined information in a predetermined format into the first and second storing means on the basis of circuit information of the logic circuit; simulation executing means for executing simulation of the logic circuit as a whole using the information; first save storing means which can be accessed at a high speed; second save storing means which is accessed at a speed lower than that of the first save storing means; first saving means for saving the variable information in the first save storing means; second saving means, capable of performing saving the variable information saved by the first saving means in the second save storing means parallel to the simulation executing means; and loading means for rewriting the information in the second save storing means in the same area as that in which the information was written before the information is saved by the first saving means.

The first and second storing means may be independent information storing media or storing areas generated onto independent information storing media. In addition, these storing means may be independent storing media which are formed on one information storing medium. That is, logically independent means may be used as the first and second storing means.

When there are a plurality of kinds of pieces of constant information whose contents do not change during the simulation, the first storing means may be divided into a plurality of independent portions, and these pieces of information may be stored in the independent portions in units of the kinds of pieces of information. Similarly, when there are a plurality of kinds of pieces of variable information whose contents change, the second storing means may be divided into a plurality of independent portions, and these pieces of information may be stored in the independent portions in units of the kinds of pieces of information.

Dedicated information storing media may be formed in units of kinds of pieces of constant information whose contents do not change. Similarly, dedicated information storing media may be formed in units of kinds of pieces of variable information whose contents change. That is, in this case, the information storing media may be logically independently formed in units of kinds of pieces of information.

A logic simulation apparatus may preferably comprise a save storing means for check point process, a saving means for saving variable information whose content changes, and loading means for rewriting the variable information saved in the save storing means into the same area as that in which the information was stored before the information is saved.

A logic simulation apparatus according to the present invention may comprise a first save storing means which can be accessed at a high speed, a second save storing means which has a capacity larger than that of the first save storing means and a speed lower than that of the first save storing means, a first saving means for saving variable information whose content changes into the first save storing means, a second saving means for saving the variable information saved by the first saving means into the second save storing means, and a loading means for rewriting the information saved in the second save storing means into the same area as that in which the corresponding information was saved before the information is saved by the saving means.

In a logic simulation apparatus according to the first aspect of the present invention, variable information, such as the value of a signal or a register, whose content change during the execution process of simulation is stored in the second storing means by elaboration performed by the generating means, constant (fixed) information, such as pointer information indicating a lower-level module, whose content does not change is stored in the first storing means. In this manner, when a page on the first storing means is subjected to page-out process, although the contents of the page are written in a magnetic disk device in the first page-out process, the contents need not be written in the magnetic disk device again in the second and subsequent page-out processes because these contents do not change after the first page-out process is performed. Therefore, the page-out process can be performed at a high speed, thereby making the speed of the simulation high.

In addition, according to the present invention, since data of the same type can be continuously arranged in storing areas, an index such as the nth signal can be used in place of a pointer which is used in information and has the size of, e.g., 4 bytes. Since this index can be stored in an area having the size of, e.g., 2 bytes, saving of storing areas can be expected.

When check point process is to be executed, all the contents of areas, which are in use, of second storing means are saved. However, since the contents of the first storing means do not change, check point process need not be performed. Therefore, the check point process can be performed at a high speed.

When the first save storing means which can be accessed at a high speed is used in check point process, simulation can be restarted immediately after variable information is completely saved in the first save storing means by the first saving means. Therefore, a time for interrupting the simulation by the check point process can be considerably shortened.

A logic simulation apparatus which executes simulation of the circuit using a first simulation program with debugging function and a second simulation program with no debugging function and executed at a speed higher than that of the first simulation program on the basis of information related to the circuit subjected to the simulation, according to the second aspect of the invention is characterized by comprising: the simulation executing means for executing simulation using any one of the first and second simulation programs; specifying means for specifying time T on the simulation to be switched to the simulation using the first simulation program executed by the simulation executing means; start control means for starting the simulation using the second simulation program; stop control means for interrupting the simulation executed by the simulation executing means at which the time T; and restart control means for causing, in response to interruption of the simulation by the stop control means, the simulation executing means to restart the simulation using the first simulation program from the time T.

The first simulation program may be an interpreter simulator, and the second simulation program may be a compiled simulator. The first simulation program may be a compiled simulator with a line debugging function of described functional specifications; and the second simulation program may be a compiled simulator with no line debugging function of described functional specifications. The first simulation program may be a simulator which can be stopped in simulation cycle within simulation time, and the second simulation program may be a simulator which can be stopped only when time is updated. The first simulation program may be a delay mode simulator which accurately evaluates delay of the circuit, and the second simulation program may be a high-speed simulator with no delay. The second simulation program may be a cycle base simulator for evaluating function between clocks by one simulation cycle. The first simulation program may be a simulator having a function of checking the activation of each statement in the functional specification description, and the second simulation program may be a simulator having no function included in the first simulation program.

In a logic simulation apparatus according to the second aspect of the present invention, when a user inputs time T at which the user starts debugging using an interactive simulation program with an interactive debugging function, the simulation is started using a batch simulation program which has no interactive debugging function and can be executed at a higher speed. When time T is reached, the simulation executed by batch simulation program is switched to the simulation executed by the simulation program with an interactive debugging function. The user starts debugging from time T using the simulation program with an interactive debugging function.

According to the second aspect of the present invention, with respect to execution of the logic simulation of a circuit, the simulation is executed at a high speed up to the start time of debugging by the batch simulation program with no interactive debugging function. When time has reached the start time of the debugging, the simulation is switched to the one with an interactive debugging function at a high speed. Therefore, according to the logic simulation apparatus according to the present invention, debugging can be quickly started from the start time compared with a conventional logic simulation apparatus. In other words, a user can obtain the same effect as that obtained by increasing the speed of a conventional simulation with a trace function.

A logic simulation apparatus which executes the simulation of the circuit using one selected from at least two simulation programs having different simulation speeds and different compiling times on the basis of information related to a circuit subjected to the simulation, according to the invention is characterized by comprising: at least two simulation executing means for compiling a predetermined one of the simulation programs to make the simulation program executable and then executing simulation using the simulation program which is made executable, the at least two simulation executing means using different simulation programs; first start control means for causing the at least two simulation executing means to start a compiling; detecting means for detecting the simulation executing means which has completed the compiling; second start control means for causing the simulation executing means which is detected by the detecting means for the first time to start simulation using an executable simulation program of the detected simulation executing means; evaluation selecting means for evaluating whether the simulation executing means which is newly detected by the detecting means can execute simulation at a speed higher than that of the simulation executing means which is executing simulation at this time, and selecting the newly detected simulation executing means when it is evaluated that the newly detected simulation executing means can execute simulation at a speed higher than that of the simulation executing means which is executing simulation at this time; stop control means for, when the newly detected simulation executing means is selected by the evaluation selecting means, causing the simulation executing means which is executing the simulation to interrupt the simulation which is being executed; and restart means for, in response to interruption of the simulation by the stop control means, restarting the simulation using an executable simulation program of the newly selected simulation executing means from the time at which the simulation is interrupted.

The evaluation selecting means may include means for generating a target table of simulation program names and data related to the simulation speeds of the simulation programs; and means for comparing, using the target table, the simulation speed of a newly detected executable simulation program with the simulation speed of another simulation program which has been made executable.

The simulator includes at least one interpreter simulator and at least one compiled simulator or at least one direct compiled simulator.

The apparatus according to the third aspect is characterized by further comprising brawzer means, having at least display program, for displaying predetermined information during the simulation. The brawzer means further includes means for changing the predetermined information on the basis of request of user.

In a logic simulation apparatus according to the second aspect of the present invention, two or more simulation programs having different simulation speeds and compiling times simultaneously begin to be compiled. A simulation is started using a program completed to be compiled first.

Thereafter, each time the compiling of another simulation program is completed, it is evaluated whether the simulation program is the fastest program in executable programs at present. If the simulation program is the fastest program, the simulation which is in execution is interrupted, the simulation program which is in use is switched to the fastest simulation program, and the simulation is restarted. These operations are repeated. That is, simulation is sequentially switched to faster simulation. Since this switching is automatically performed with the user being kept unrecognized, the switching operation can be performed at a high speed.

According to the second aspect of the present invention, since the simulation program obtained by efficiently coupling a plurality of simulation programs to each other is used, simulation can be executed at a speed higher that of a conventional technique in which only one simulation program is used.

The simulation program according to the present invention does simply use hardware resources, as is known to those who are skilled in the art.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 3 is a schematic diagram showing the arrangement of a logic simulation apparatus according to the present invention;

FIGS. 4A to 4D are views showing the first embodiment of the present invention;

FIG. 5 is a chart showing main procedures related to the corresponding simulation executed by a logic simulation apparatus according to the first embodiment;

FIG. 6 is a diagram showing an arrangement of circuit blocks;

FIG. 7 is a view showing an example of circuit block information subjected to the simulation;

FIG. 8 is a view showing an example of information related to a signal;

FIG. 9 is a view showing an example of information related to a pin;

FIG. 10 is a view showing an example of information related to an event;

FIG. 26 is a diagram showing the fourth embodiment;

FIG. 27 is a view showing information stored in a storing section in FIG. 26;

FIG. 28 is a diagram showing a circuit subjected to the simulation;

FIG. 34 is a view for explaining the operation of the logic simulation apparatus in FIG. 26;

FIG. 35 is a diagram showing the fifth embodiment;

FIG. 36 is a flow chart showing the flow of the execution control section in FIG. 35;

FIG. 37 is a view for explaining the operation of the logic simulation apparatus in FIG. 35;

FIG. 38 is a flow chart showing the flow of simulation executing section in FIG. 35; and FIG. 39 is a diagram showing the sixth embodiment.

DETAILED DESCRIPTION OF THE PREFERRED EMBODIMENTS

Figure 1:
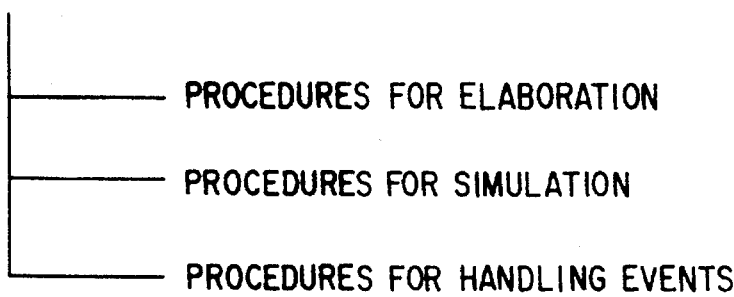
FIG. 1 is a chart showing main procedures related to corresponding simulation executed by a conventional logic simulation apparatus.

Embodiments of the present invention will be described below with reference to the accompanying drawings. The same reference numerals and symbols denote the same parts throughout the drawings, and a description thereof will be omitted.

A logic simulation apparatus according to the first embodiment of the present invention will be described below.

FIG. 3 is a schematic diagram showing the arrangement of a logic simulation apparatus according to the present invention.

This logic simulation apparatus comprises storing devices A1 to A3, a storing device A4, another information storing medium, an execution control section, a display device, and an input device.

The storing devices A1 to A3 store data related to a circuit subjected to simulation. The storing device A4 stores data related to events generated by the execution process of the simulation.

FIGS. 4A to 4D respectively show the storing devices A1, A2, A3, and A4 arranged in the logic simulation apparatus of the first embodiment.

An execution control section 11 executes simulation and other processes such as check point process.

An information storing medium 12 is a storing device other than the storing devices A1 to A4 such as main storage devices.

A display section 13 displays data related to simulation.

An input section 14 inputs data required for simulation.

The storing devices A1 to A3 store, in units of kinds of information, predetermined information generated by elaboration (see the Description of Related Art for the details of the elaboration) to circuit information hierarchically described using a hardware description language. For example, the storing device A1 stores information related to the hierarchical structure of a circuit block, the storing device A2 stores information related to the signals defined inside a circuit block, and the storing device A3 stores information related to the pins of the circuit block. In the first embodiment, constant data and variable data are separately stored in the storing devices. More specifically, the storing devices A1 and A3 store constant data whose values do not change, and the storing devices A2 and A4 store variable data whose values change in the execution process of simulation.

Pointers to unused area 1 to 4 are formed in the storing devices A1 to A4 or other information storing media related to the execution control section 11, and respectively indicate the top addresses of the unused storing areas of the storing devices A1 to A4. As shown in FIGS. 4A to 4D, when the top addresses of the unused storing areas of the storing devices A1 to A4 are addresses a101, a102, a103, and a104, respectively, the contents of the unused area pointers 1 to 4 become a101, a102, a103, and a104, respectively.

In FIGS. 4A to 4D and FIGS. 12A to 17D, each rectangle expressed in each of the storing devices A1 to A4 indicates a storing area, each symbol added to the right side of each rectangle indicates the address of the corresponding rectangle, and the content of the storing area corresponding to the start point of each arrow indicates the address of the storing area corresponding to the end point of the corresponding arrow. A symbol added to left side of each rectangle indicates which one of areas f1 to f13 (to be described later) corresponds to the content of data stored at the storing position to which the corresponding symbol is added.

FIG. 5 shows main procedures (functions) related to simulation executed by the logic simulation apparatus according to the present invention. Simulator according to the present invention has procedures for elaboration, procedures for simulation, which is used for actually executing the simulation, and procedures for handling events, which is used for controlling events generated by the execution of the simulation. The procedures for elaboration has a plurality of procedures for elaboration corresponding to a plurality of circuit blocks.

Data related to a circuit subjected to simulation are described with a hardware description language in units of circuit blocks. Each circuit block is defined using a hierarchical structure which represents an upper-level circuit block by a combination of smaller circuit blocks. FIG. 6 shows an example obtained by visually representing the arrangement of the hierarchically described circuit. A circuit block 17 is combined with another circuit block as one constituent element of an upper-level circuit block 16 (not shown) to constitute an upper-level circuit block. In addition, the circuit block 17 is constituted by a circuit block 18 and a circuit block 19. If the circuit blocks 18 and 19 are not lowest-level circuit blocks, each of these blocks includes a plurality of lower-level circuit blocks. Each circuit block represents a logic assembly such as a processor board, a microprocessor chip, an ALU, or a register.

Each circuit block includes pins for obtaining connection with an external circuit, and information related to internal signals. For example, in FIG. 6, the circuit block 17 includes pins 20 to 23 and information related to signals S1 and S2. Each circuit block includes data related to the function of the circuit block, i.e., to operation between the internal signals, together with data related to the structure of the circuit. For example, data related to operation is information representing that, when the value of a signal at the pin 20 changes from "Hi" (high) to "Low", the value of a signal at the pin 22 changes from "Low" to "Hi" after 1 ns.

Data generated by elaboration on the storing devices A1 to A3 will be described below.

Information related to a circuit block is assigned (stored) to the storing device A1. The information related to a circuit block is data representing the hierarchical structure of a circuit block obtained by hierarchically coupling a plurality of circuit blocks to each other, and representing coupling relationships of signals and pins. More specifically, in the storing device A1, as shown in FIG. 7, the following information is stored in the areas f1 to f5. As described above, information related to a circuit block does not change in the execution process of simulation.

The area f1 stores a pointer (i.e., an address of a storing area in which the area f1 of an upper-level circuit block is stored) representing the upper-level circuit block (the circuit block 17 with respect to the circuit block 18 in FIG. 6). The area f2 stores a pointer representing one (e.g., the circuit block 19 with respect to the circuit block 17) of the lower-level circuit blocks. The area f3 stores a pointer representing one (e.g., the circuit block 18 with respect to the circuit block 19) of the same-level circuit blocks. The hierarchical structure of the circuit blocks with respect to the entire circuit is represented by the information stored in the areas f1 to f3.

The areas f4 and f5 store information related to various numbers of signals and pins included in each circuit block. The areas f4 and f5 store pointers related to information of the first signal and information of the first pin (which are to be described later).

The areas f1 to f5 are repeatedly stored as a series of data starting from the storing position indicated by the pointer to unused area 1 in FIG. 4A. Subsequent areas f6 to f8, an area f9, or areas f10 to f13 are repeatedly stored as a series of data starting from the storing position indicated by the pointer to unused area 2, 3, or 4 as shown in FIG. 4B, 4C, or 4D like the areas f1 to f5.

Information related to signal is assigned (stored) to the storing device A2. As the information related to signal, as shown in FIG. 8, the area f6 stores a current signal value, the area f7 stores time at which signal value changed to the current signal value, and the area f8 stores the operation to be executed when the signal value changes. The contents of the areas f6 and f7 change during the execution of simulation.

Information related to pins is assigned (stored) to the storing device A3. Since each pin is principally connected to a signal defined outside a circuit block, as shown in FIG. 9, the area f9 stores, as information related to pins, a pointer indicating corresponding signal information. This information does not change during the execution of simulation.

Information related to events is assigned (stored) to the storing device A4. Although this information does not represent the state of a circuit subjected to simulation, the information is data required for events control, that is controlling signal assignment which is effective at certain time in the process of simulation. As the information of events, as shown in FIG. 10, the area f10 stores a pointer indicating signal information to be assigned, the area f11 stores a value to be assigned, the area f12 stores time at which assignment is effective, and the area f13 stores a pointer indicating next event information at the same time. The contents of the areas f10 and f13 change during the execution of simulation.

A procedure for generating circuit block information by elaboration will be described below.

In a logic simulation apparatus, in each circuit block, a procedure for elaboration for generating information of this circuit block, signal information, and pin information for the storing devices A1 to A3 is prepared. When the logic simulation apparatus is operated by calling the elaboration procedure, circuit block information is generated. An elaboration procedure for each circuit block is executed such that, in a procedure corresponding to an upper-level circuit block, a procedure corresponding to a circuit block having level lower than the circuit block is called. For example, procedure for elaboration P17 for generating circuit block information D17 related to the circuit block 17 is called in the procedure for the elaboration P16 corresponding to the upper-level circuit block 16 (not shown) and executed. While the procedure P17 is executed, the circuit block 17 calls procedures P18 and P19 respectively corresponding to the lower-level circuit blocks 18 and 19, thereby executing the procedures P18 and P19. Upon completion of execution of the procedures P18 and P19, the control flow returns to the procedure P17. Upon completion of execution of the procedure P17, the control flow returns to the procedure P16.

Figure 11:
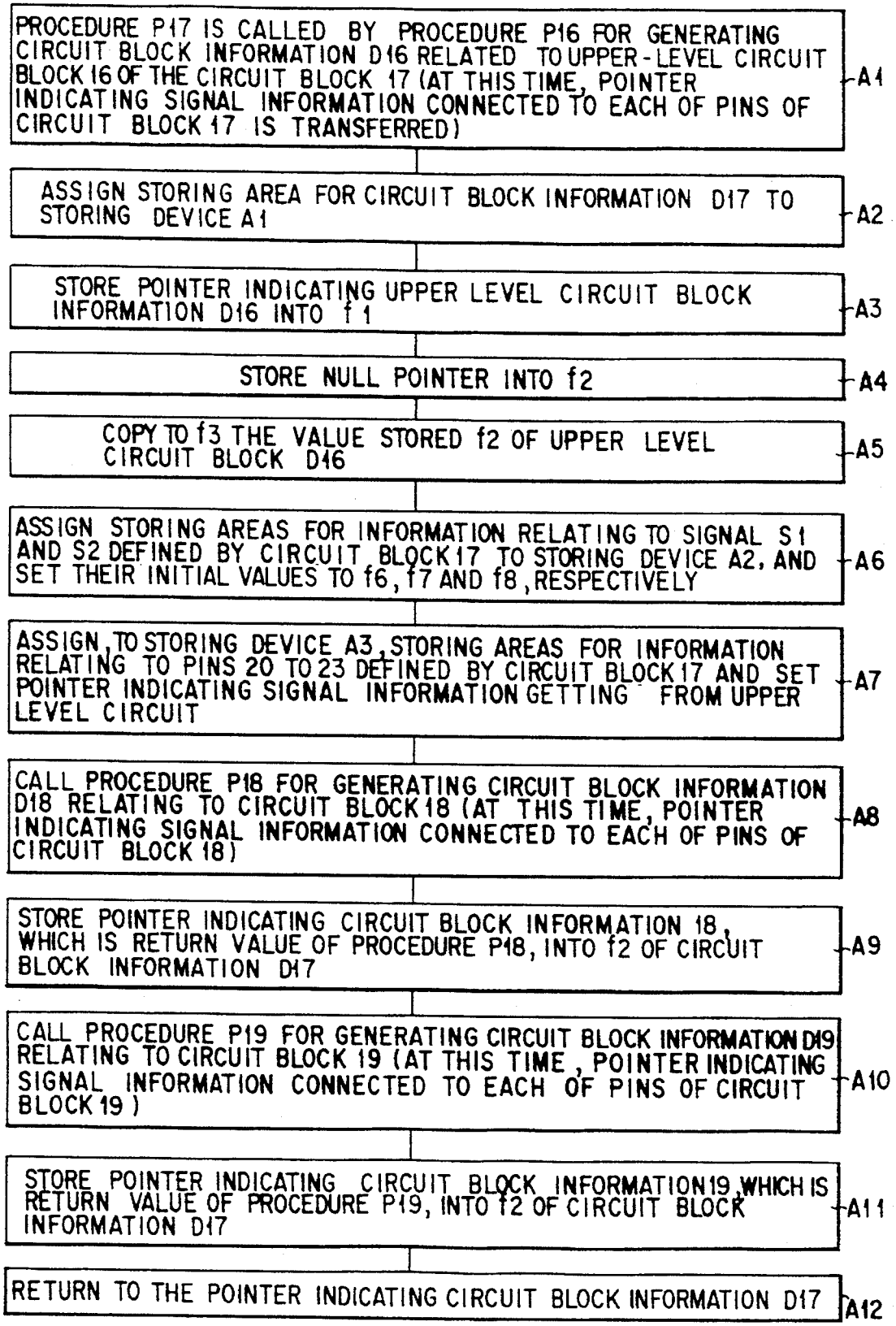
FIG. 11 is a flow chart showing a procedure for generating circuit block information.
Figure 12:
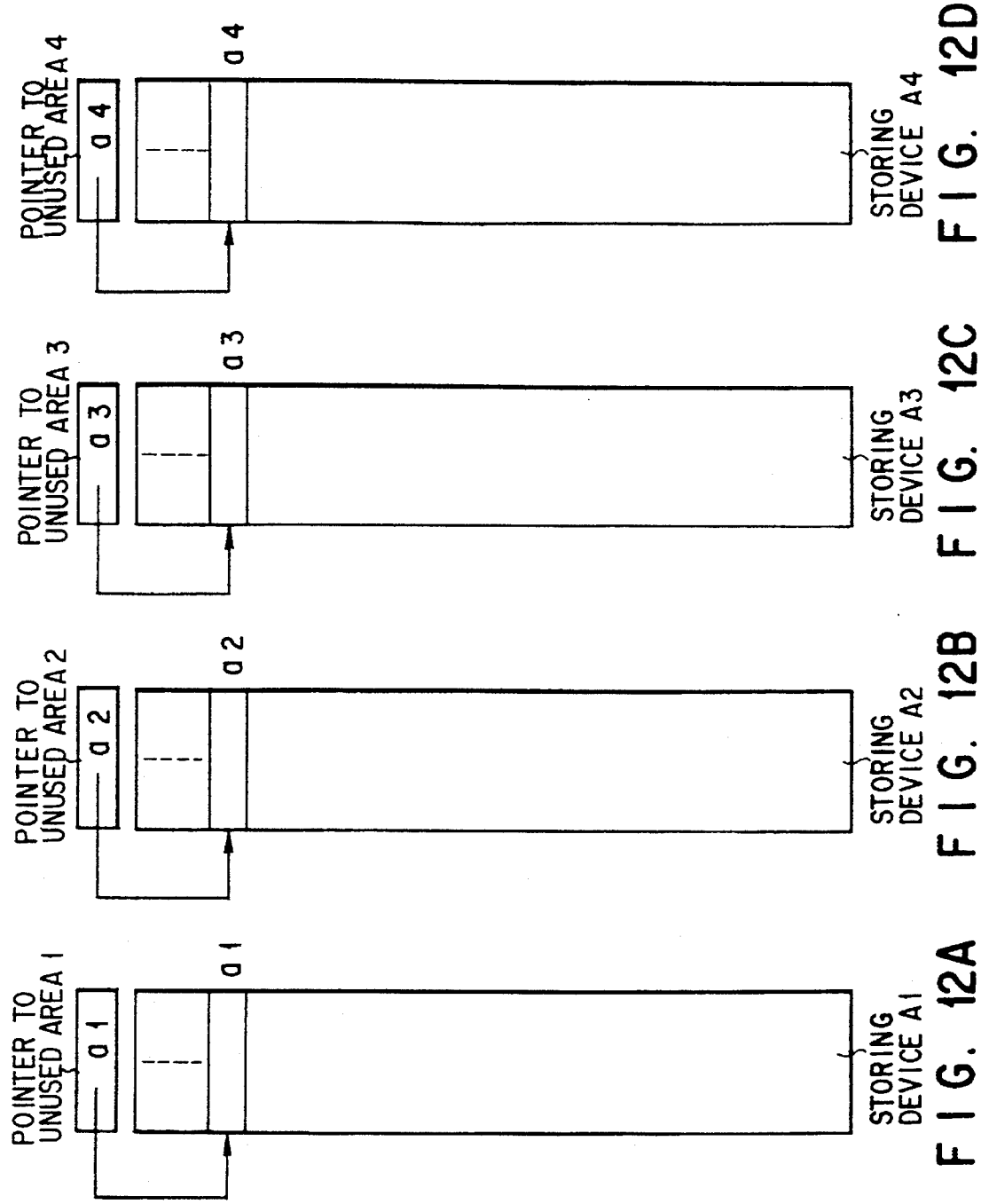
FIGS. 12A to 12D are views showing a generating process of circuit information executed by a procedure for elaboration according to the first embodiment.
Figure 13:
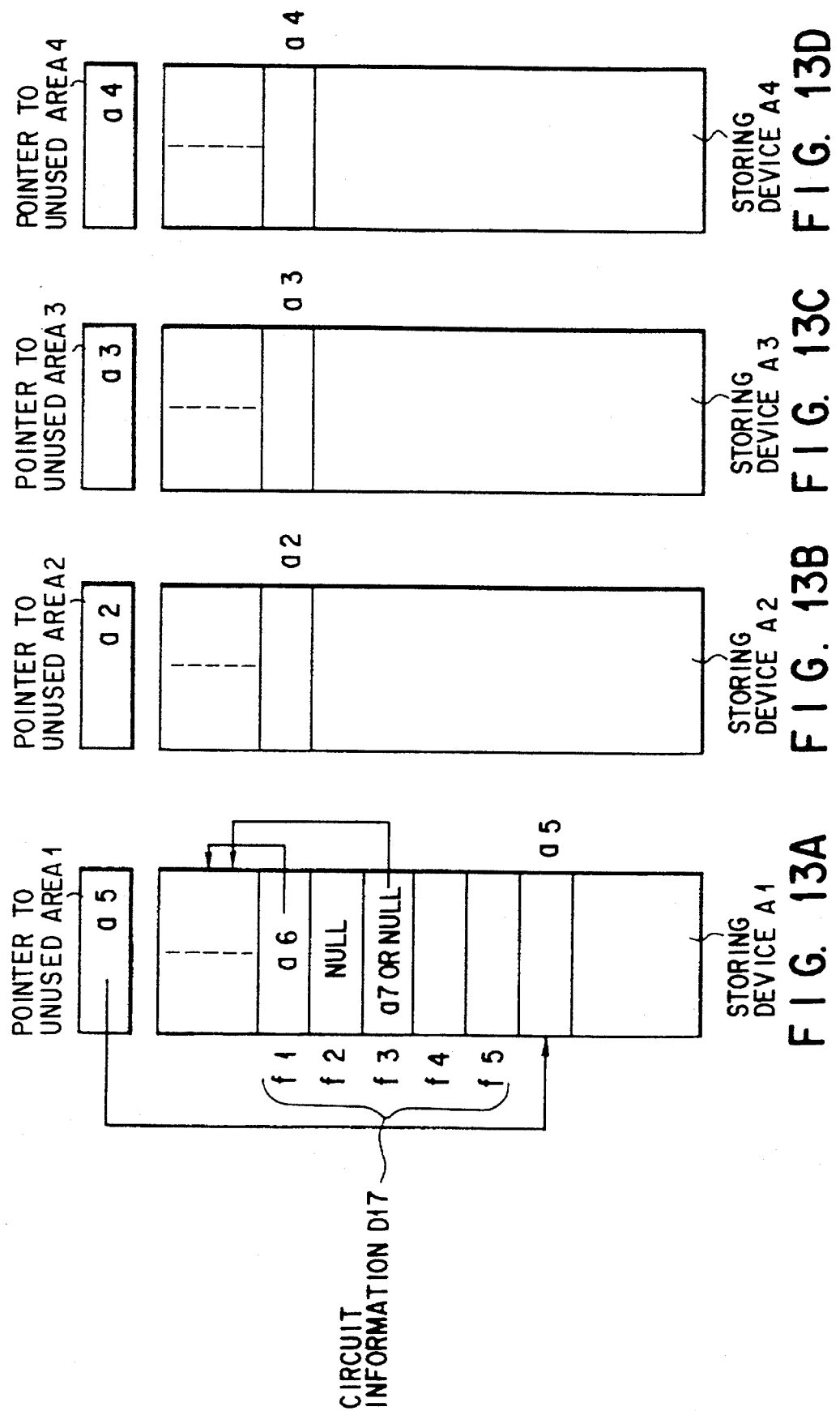
FIGS. 13A to 13D are views showing a generating process of circuit information executed by a procedure for elaboration according to the first embodiment.
Figure 14:
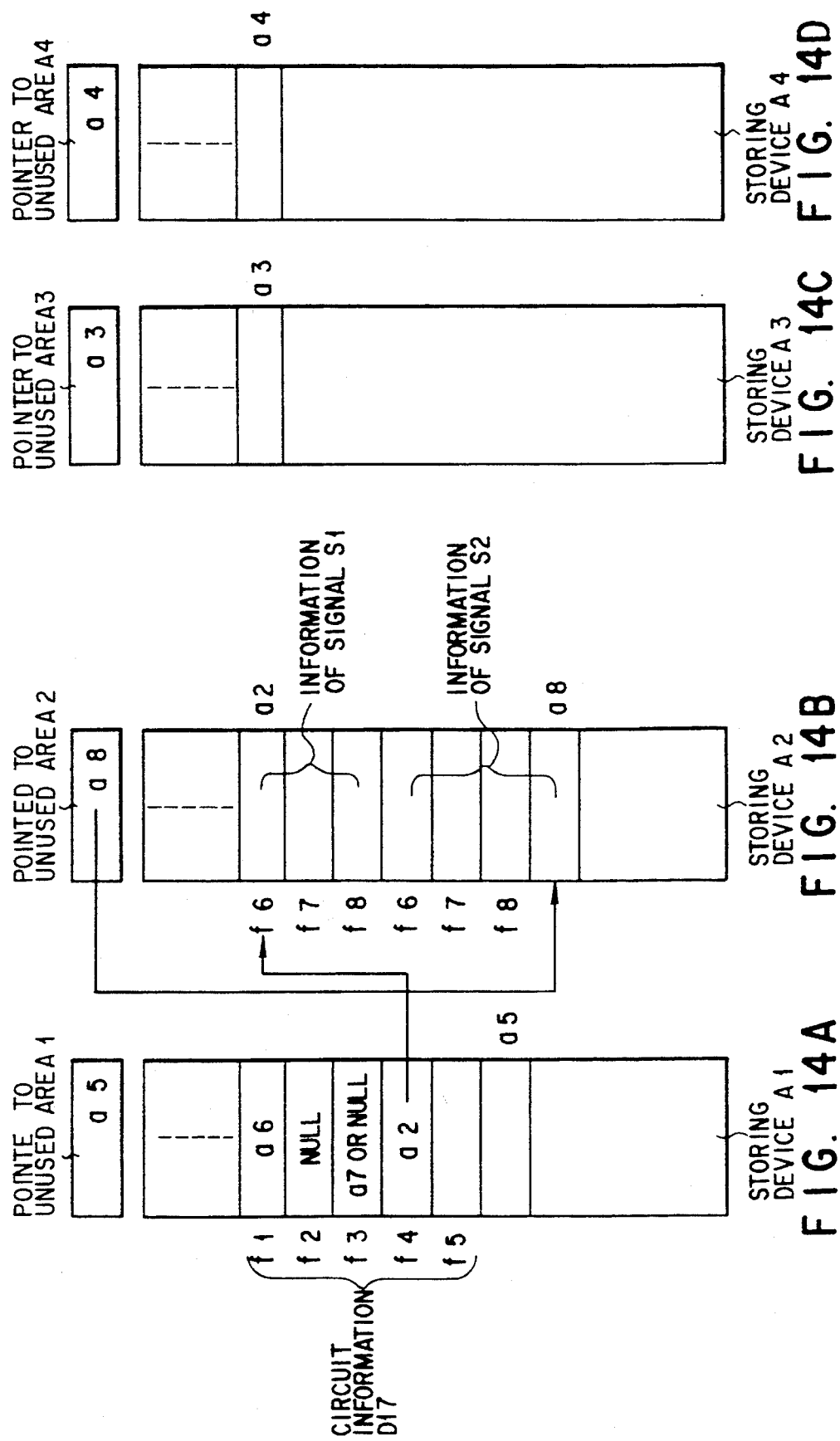
FIGS. 14A to 14D are views showing a generating process of circuit information executed by a procedure for elaboration according to the first embodiment.
Figure 15:
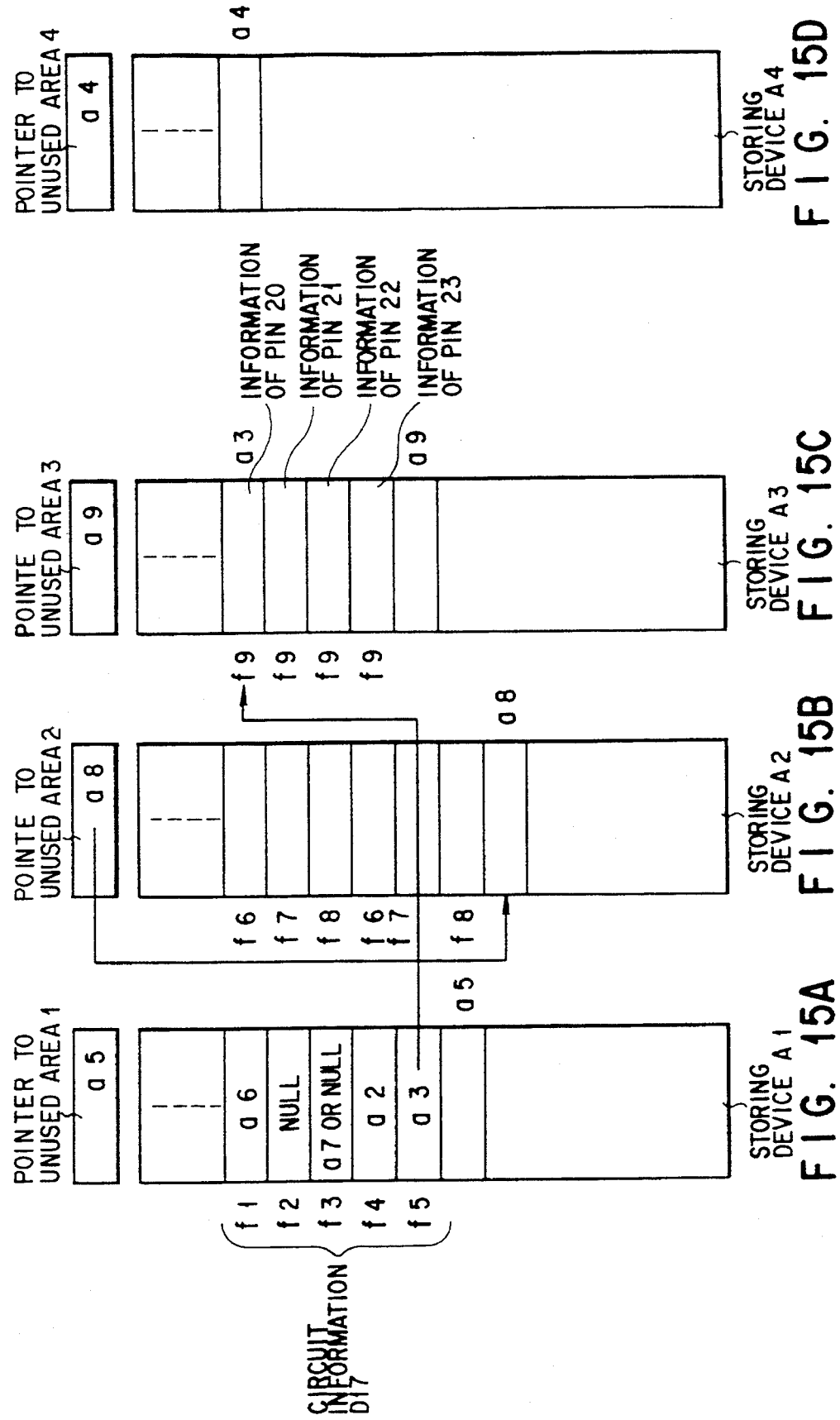
FIGS. 15A to 15D are views showing a generating process of circuit information executed by a procedure for elaboration according to the first embodiment.
Figure 16:
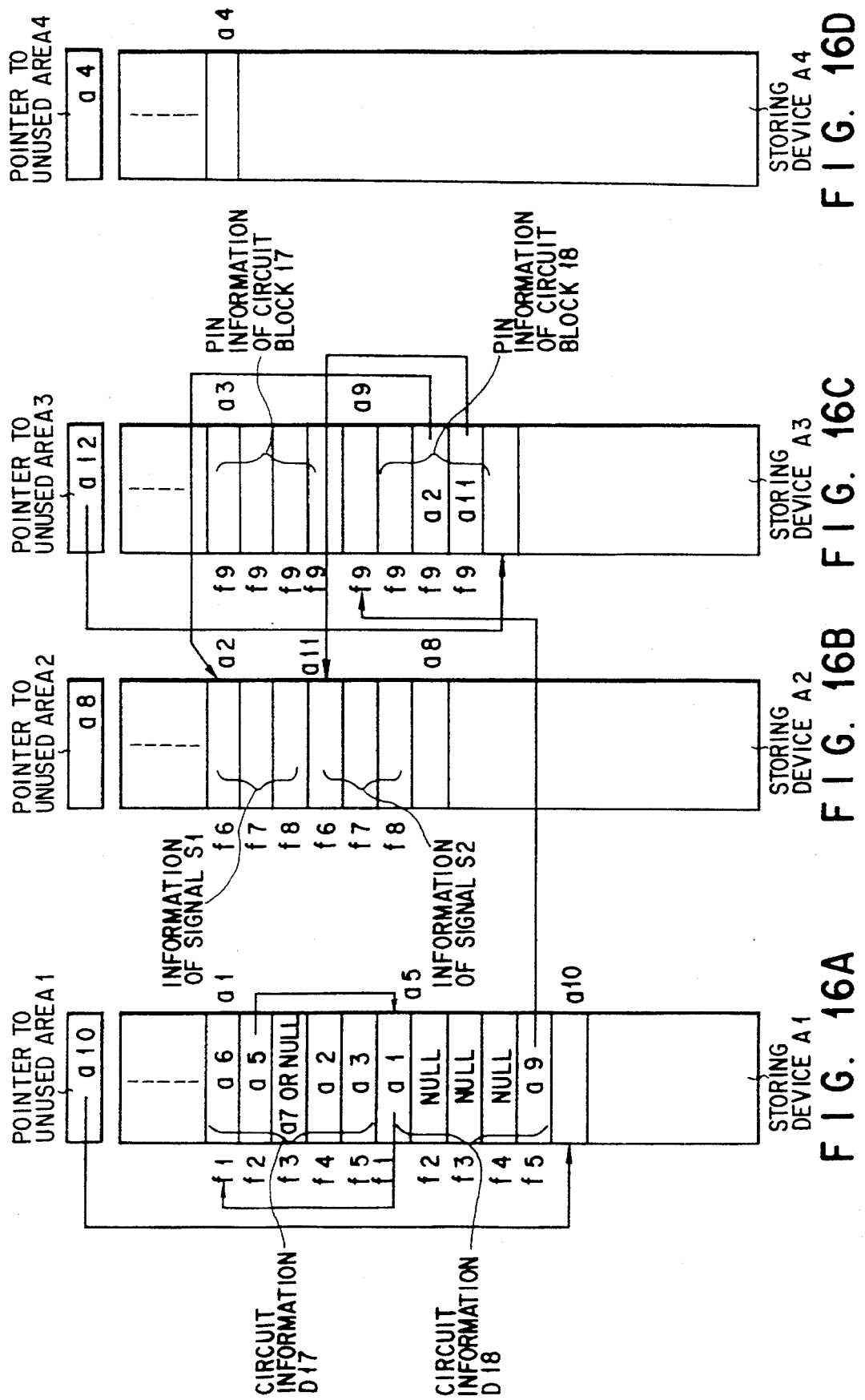
FIGS. 16A to 16D are views showing a generating process of circuit information executed by a procedure for elaboration according to the first embodiment.
Figure 17:
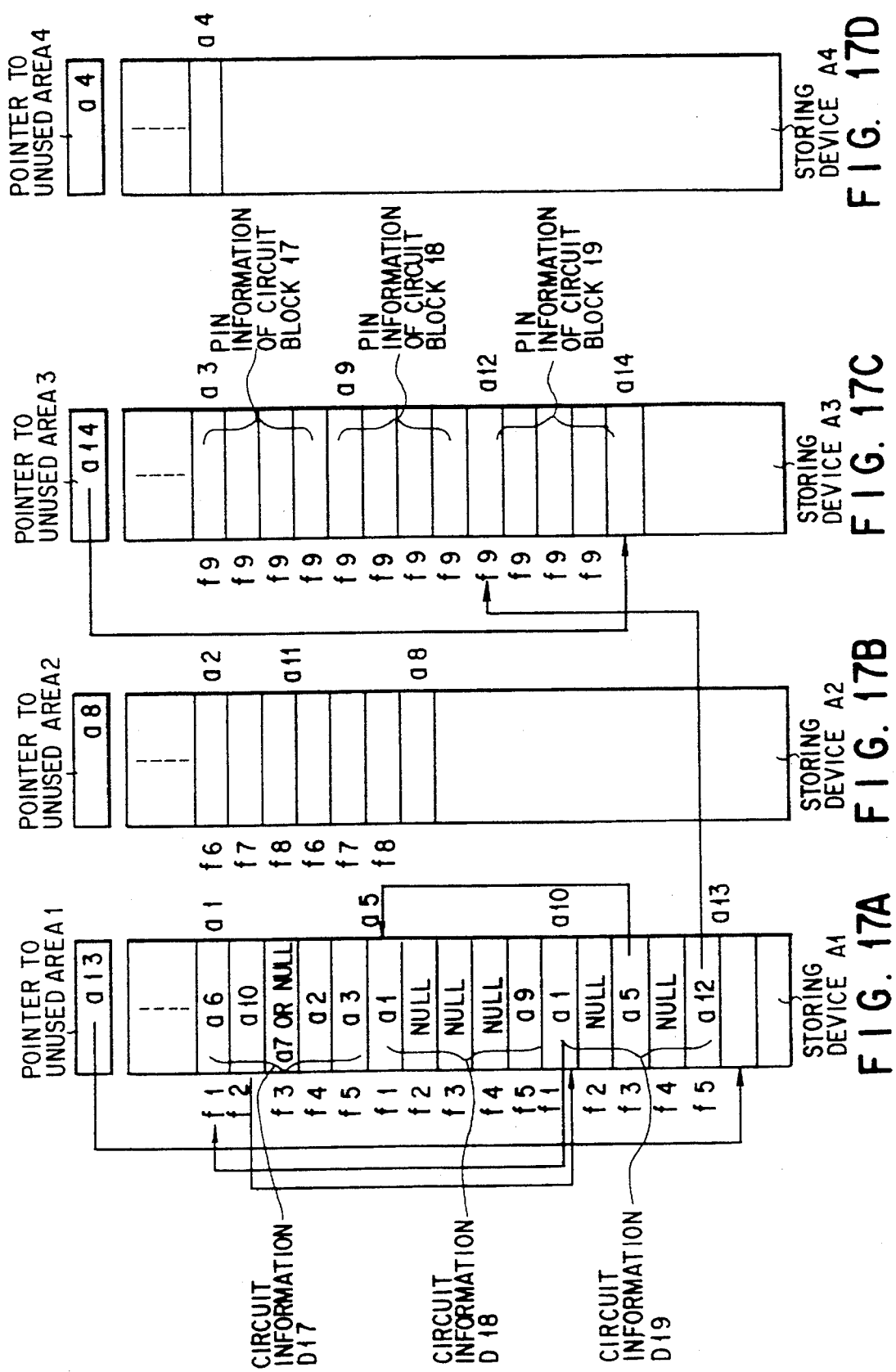
FIGS. 17A to 17D are views showing a generating process of circuit information executed by a procedure for elaboration according to the first embodiment.

Elaboration for the circuit block shown in FIG. 6 will be described in detail with respect to elaboration sequence executed by the procedure P17 (shown in FIG. 11) corresponding to the circuit block 17.

The procedure P17 is started such that the procedure P17 is called from the procedure P16 corresponding to the upper-level block 16 (not shown) (step A1). As shown in FIGS. 12A to 12D, before the elaboration is started, the unused area pointers 1 to 4 indicate top addresses a1 to a4 of the storing devices A1 to A4, respectively.

In the procedure P17, in order to store information D17 corresponding to the circuit block 17 in the storing device A1, the area starting from the position a1 indicated by the pointer to unused area 1 of the storing device A1 is allocated (step A2), and the value of the pointer to unused area 1 is updated to a5 by the size of the information D17 of the circuit block (FIG. 13A).

A pointer (represented by a6) indicating upper-level block information D16 which has called the procedure P17 is stored in the area f1 of the information D17 (step A3). At this time, since information related to lower-level circuit block has not been generated, null pointer is stored in the area f2 of the information D17 (step A4). Since a pointer indicating circuit block information having the same level as that of the circuit block 17 may be stored in the area f2 of the upper-level circuit block information D16, the value (represented by a7) of this pointer is stored in the area f3 of the information D17 (step A5). If there is no circuit block having the same level as that of the circuit block 17, null pointer is stored in the area f2 of the upper-level circuit block information. In this case, the null pointer is stored in the area f3 (step A5). The contents of the storing devices obtained at this time are shown in FIGS. 13A to 13D, respectively.

In order to store information related to the signals S1 and S2 included in the circuit block 17 in the storing device A2, areas whose number corresponds to the number of signals are assigned from the area indicated by the pointer to unused area 2, and the pointer to unused area 2 is advanced to the address a8. With respect to the signals S1 and S2, an initial value, initial time, and the type of operation are written in the areas f6, f7, and f8, respectively (step A6). The area f4 of the circuit information D17 of the storing device A1 stores a2 which is a pointer indicating the first signal information. The contents of the storing devices obtained at this time are shown in FIGS. 14A to 14D, respectively.

In order to store information related to the pins 20 to 23 included in the circuit block 17 in the storing device A3, areas whose number corresponds to the number of pins are assigned from the area indicated by the pointer to unused area 3, and the pointer to unused area 3 is advanced to the address a9. Thereafter, pointers indicating external signals respectively connected to the pins are written in the area f9 (step A7). The area f5 of the information D17 of the storing device A1 stores a3 which is a pointer indicating the first pin information. The contents of the storing devices are shown in FIGS. 15A to 15D, respectively.

In order to execute the elaboration for the circuit block 18 having level lower than that of the circuit block 17, the procedure P18 for elaboration, which corresponds to the circuit block 18, is called. At this time, pointer indicating signal information connected to each of the pins of the circuit block 17 is sent to the circuit block 18. Since the procedure P18 is the same as the procedure P17, a detailed description of the operation of procedure P18 will be omitted.

The procedure P18 executes elaboration for the circuit block 18. The area f1 of the circuit block information D18 stores a1 which is the top address of the circuit block information D17, the areas f2 to f4 store null pointers, the area f5 stores a9 which is the pointer indicating the first pin information. In two areas f9 of the pin information of the circuit block 18, a2 and a11 which are pointers indicating the signals S1 and S2 are stored, respectively. The contents of the unused area pointers 1 and 3 change to a10 and a12, respectively.

When there are circuit blocks each having level lower than that of the circuit block 18, the procedure P18 calls procedures corresponding to the lower-level circuit blocks in the same manner as described above to elaborate them. In the procedure P18, upon completion of all the elaboration operations related to the procedure P18, the pointer indicating the circuit block information D18 is returned to the procedure P17 as a return value (step A8). In this embodiment, it is assumed that there are no circuit blocks each having level lower than that of the circuit block 18.

In the procedure P17, the return value represented by a5 is stored in the area f2 of the circuit block information D17 (step A9). The contents of the storing devices obtained at this time are shown in FIGS. 16A to 16D, respectively.

In the procedure P17, the same process as described above is also executed for the circuit block 19 (step A10). As a result, the area f1 stores the pointer a1, the areas f2 and f4 respectively store null pointers, the area f3 stores the pointer a5 indicating the circuit block information D18, and the area f5 stores the pointer a12 indicating the first pin information. The contents of the unused area pointers 1 and 3 change to a13 and a14, respectively. Finally, a pointer a10 indicating the circuit block information D19 is returned as a return value (step A11).

In the procedure P17, the return value a10 of the procedure P19 called latest is stored in the area f2, and the pointer a1 indicating the information D17 is returned to the called procedure P16 as a return value (step A12). The contents of the storing devices obtained at this time are shown in FIGS. 17A to 17D, respectively.

With the above procedures, elaboration for the circuit information corresponding to the circuit in FIG. 6 is completed. In this case, content of the area f2 indicates a first low-level circuit block, when there are a plurality of low-level circuit blocks and blocks with same level may be linked by information of f3.

Upon completion of the elaboration, the execution control section 11 starts procedures for simulation to execute simulation. During the simulation, event information generated by procedures for handling events is stored in the storing device A4, or event information stored in the storing device A4 is read out.

In the first embodiment, with respect to data related to simulation, as described above, constant data and variable data are separately stored in the storing devices A1 to A4. Especially, in the execution of simulation, since the contents of the storing devices A1 and A3 do not change, contents written in the magnetic disk device when the first page-out process for pages included in the storing devices A1 and A3 do not change in subsequent operations. For this reason, in page-in process, since the contents written on the magnetic disk device by the first page-out process is preferably used, the contents of the corresponding pages need not be saved in the magnetic disk device in processes subsequent to the second page-out process. Therefore, when page-out processes are required, the subsequent page-out processes are not necessary at a higher probability than that of conventional simulation. For this reason, the page-out processes can be executed at a high speed.

A check point process can be executed for only the contents of the storing devices A2 and A4 whose contents do not change. For this reason, the check point process can also be executed at a high speed.

In the first embodiment, the storing device A1 stores only pieces of circuit block information, and the sizes of the pieces of circuit block information are equal to each other. In this case, for example, the area f1 of each of the pieces of circuit block information can store, in place of pointer indicating another piece of circuit block information, data indicating the index of the corresponding circuit block information. Therefore, although the conventional pointer requires a size of 4 bytes, since a pointer requires a size of 2 bytes when the number of circuit blocks is smaller than $2^{16}$, storage size required in the storing device A1 can be effectively reduced.

As a modification of the first embodiment, a case wherein, when one storing device B is given, the storing device B is used such that the storing device is divided into storing devices (i.e., storing areas) A1' to A4' or the storing area of the storing devices B is partially assigned to the storing devices (i.e., storing areas) A1' to A4' will be described below.

Since the arrangement of an apparatus according to this modification is the same as that of the apparatus according to the first embodiment except that one storing device B is arranged in place of the storing devices A1 to A4 shown in FIGS. 4A to 4B, an illustration and detailed description thereof will be omitted. It is assumed that data stored in the storing devices A1' to A4' are the same as those stored in the storing devices A1 to A4 shown in FIGS. 4A to 4D, respectively.

Figure 18:
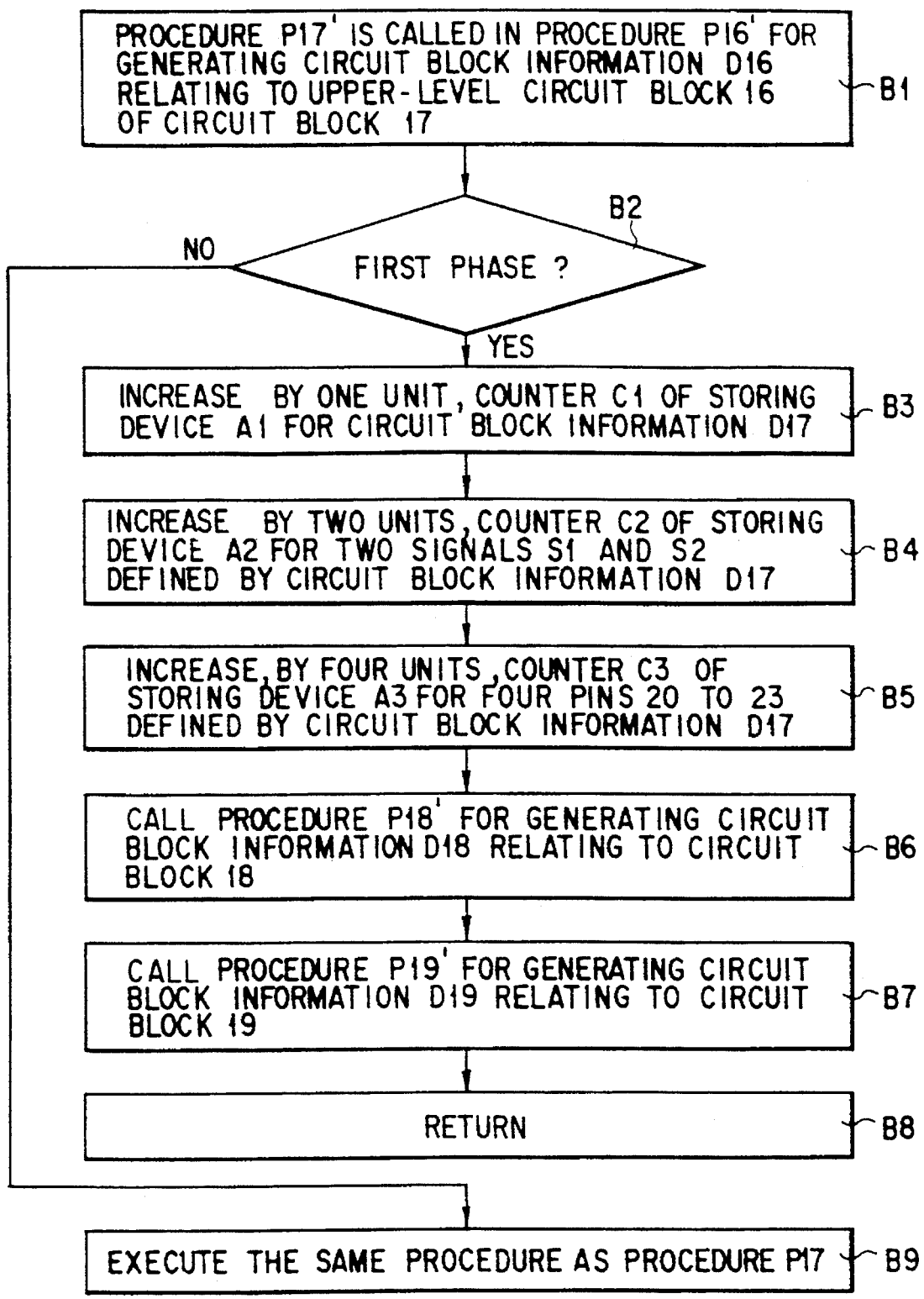
FIG. 18 is a flow chart showing another procedure for generating circuit block information.

In this modification, elaboration is executed in two phases. A procedure P17' which used in this case and generates information for the circuit block 17 shown in FIG. 6 is shown in FIG. 18.

(i) First Phase

In the first phase, the storing devices A1' to A4' are allocated in the storing device B.

Procedures for elaboration are sequentially called from the circuit module located at the uppermost level. For example, when the procedure P17' is called by a procedure P16' for the circuit block 16 (not shown) (step B1), in the first phase (step B2), elaboration is not actually executed, and the sizes of areas required for storing circuit information are accumulated in units of kinds of circuit blocks or signals (steps B3 to B5). In this procedure P17', procedures P18' and P19' for generating the circuit blocks 18 and 19 are sequentially called in the procedure P17'. Upon completion of all the procedures related to the procedure P17', the flow returns to the procedure P16'.

As described above, upon completion of the first phase of each of generating procedures, on the basis of the sum values of the types, the storing device B is divided into the storing devices A1' to A4', or the storing devices A1' to A4' are defined on the storing device B.

(ii) Second Phase

In the second phase, elaboration is performed in the same sequence as that of the first embodiment. For example, as a procedure P17', the same procedure as the procedure P17' is executed (steps B2 and B9).

With the above operations, the same effect as described in the first embodiment can be obtained in this modification.

A main storage device (not shown) related to the execution control section 11 may be used as the storing device B, and the storing area of the main storage device may be partially assigned to the storing areas A1' to A4', thereby constituting the modification.

As another modification of the first embodiment, the following arrangement is used. That is, two storing devices C1 and C2 are arranged, the storing device C1 is divided into storing devices (i.e., storing areas) A1 and A3, and the storing device C2 is divided into storing devices (i.e., storing areas) A2 and A4. Otherwise, the storing devices C1 and C2 are used to be partially assigned to the storing devices A1 and A3 and the storing devices A2 and A4, respectively, In this arrangement, when the same process as that of the above modification of the first embodiment is executed, the same effect as described in the modification can be obtained. A detailed description of the arrangement will be omitted for the sake of descriptive convenience.

A logic simulation apparatus according to the second embodiment of the present invention will be described below.

Figure 19:
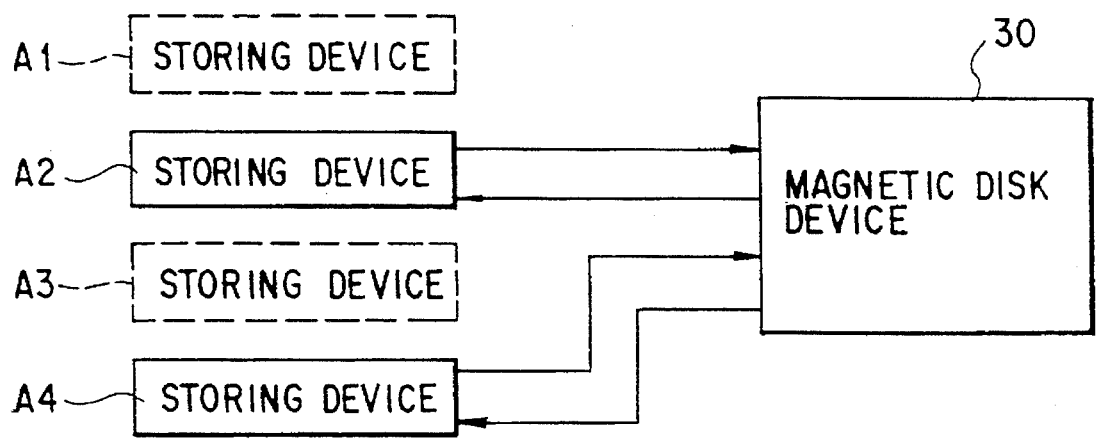
FIG. 19 is a diagram showing the second embodiment.

FIG. 19 shows storing devices A1 to A4 and a magnetic disk device 30 which are connected to this logic simulation apparatus. The logic simulation apparatus according to the second embodiment schematically comprises the storing devices A1 to A3 for storing data related to a circuit subjected to simulation, the storing device A4 for storing data related to events generated by the execution of the simulation, the magnetic disk device 30 for saving the contents of the storing devices A2 and A4 by check point process, another information storing medium (not shown) such as main storage device, an executing section (not shown) for executing other processes such as simulation, check point process, and page-in/page-out process, a display device (not shown), and an input device (not shown).

The kinds of data stored in the storing devices A1 to A4 are the same as those of the first embodiment described above, data stored in the storing devices A2 and A4 are variables (information) which change during the execution of simulation.

Figure 20:
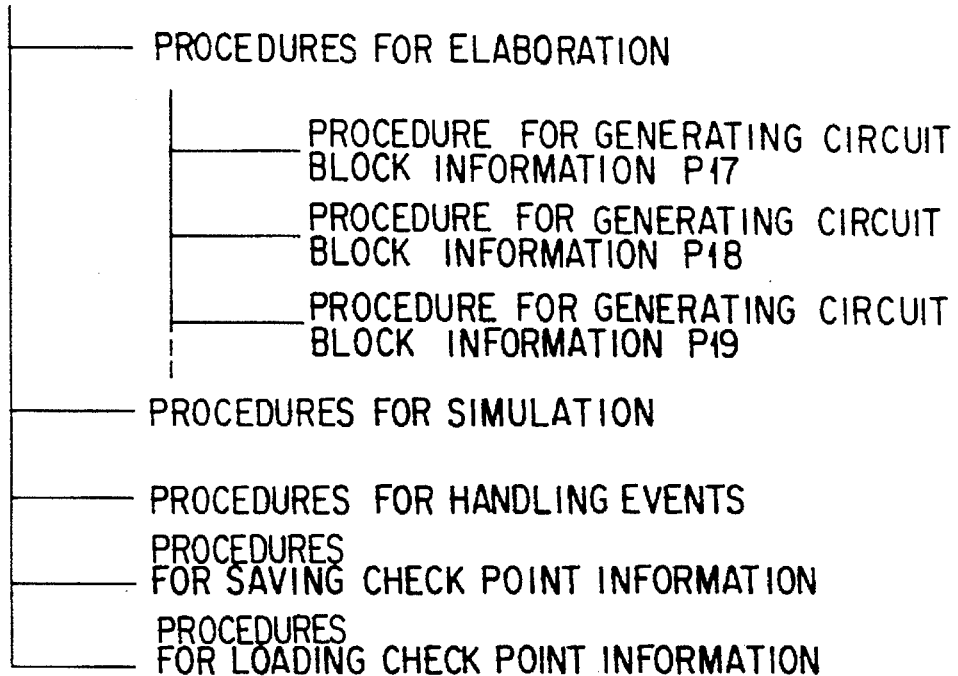
FIG. 20 is a chart showing main procedures related to the corresponding simulation executed by a logic simulation apparatus according to the second embodiment.

FIG. 20 shows main procedures (functions) executed by the logic simulation apparatus of the second embodiment. The procedures of the second embodiment include procedures for elaboration, procedures for simulation, procedures for handling events, a procedure for saving check point information, and a procedure for loading check point information. The procedures for elaboration and the elaboration therefor are the same as those of the first embodiment, a detailed description thereof will be omitted.

Figure 21:
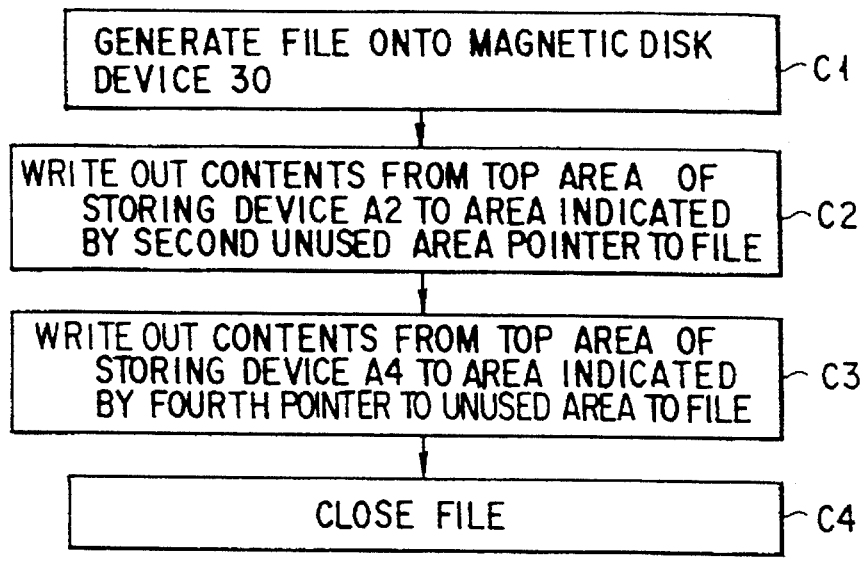
FIG. 21 is a flow chart showing a procedure for saving check point information.

A procedure for saving check point information will be described below with reference to FIG. 21.

A file is generated onto the magnetic disk device 30 for performing saving operation (step C1). The contents from the top area of the storing device A2 to the area indicated by the pointer to unused area 2 are saved in the magnetic disk device 30 (step C2). The contents from the top area of the storing device A4 to the area indicated by the pointer to unused area 4 are saved in the magnetic disk device 30 (step C3). Upon completion of the saving operations of the storing devices A2 and A4, the file is closed, and the saving process is ended (step C4).

In this case, the contents of the storing devices A2 and A4 may be continuously saved in one file (e.g., after the content of the storing device A2 is saved in a file, the content of the storing device A4 is continuously saved in the corresponding file), or may be saved in different files, respectively.

Figure 22:
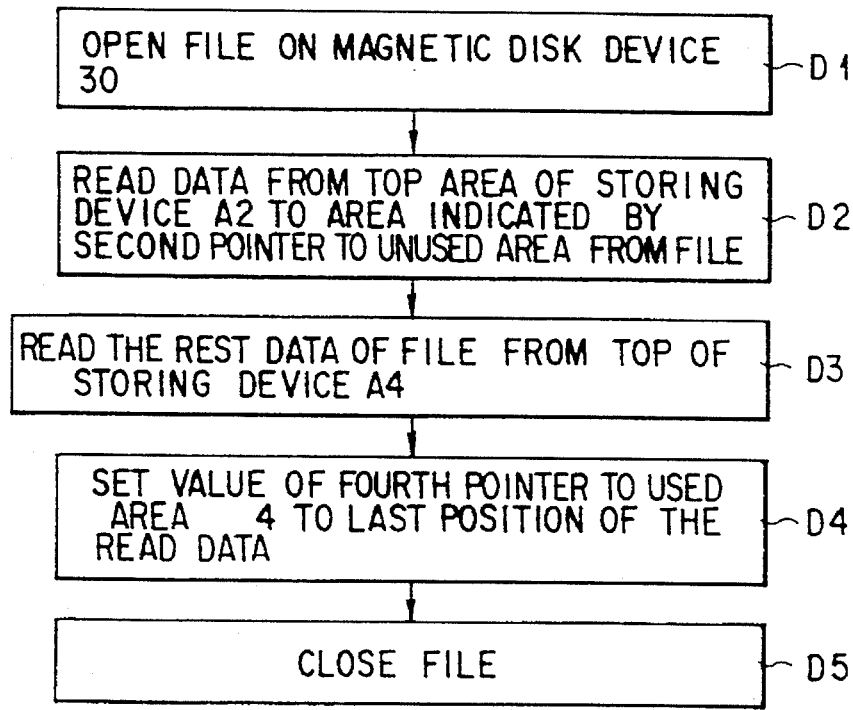
FIG. 22 is a flow chart showing a procedure for loading check point information.

The procedure for loading check point information will be described below with reference to FIG. 22. In this case, a description will be made on the assumption that one file for saving is generated on the magnetic disk device 30.

The file generated by the procedure for saving check point information onto the magnetic disk device 30 is opened (step D1). Data from the top area of the storing device A2 to the area indicated by the pointer to unused area 2 is read from the file on the magnetic disk device 30, and the data is written in the storing device A2 (step D2). Similarly, the rest data of the file is read from the top of the storing device A4 (step D3). The value of the pointer to unused area 4 is set to the last position of the read data (step D4), and the file is closed (step D5).

Figure 2:
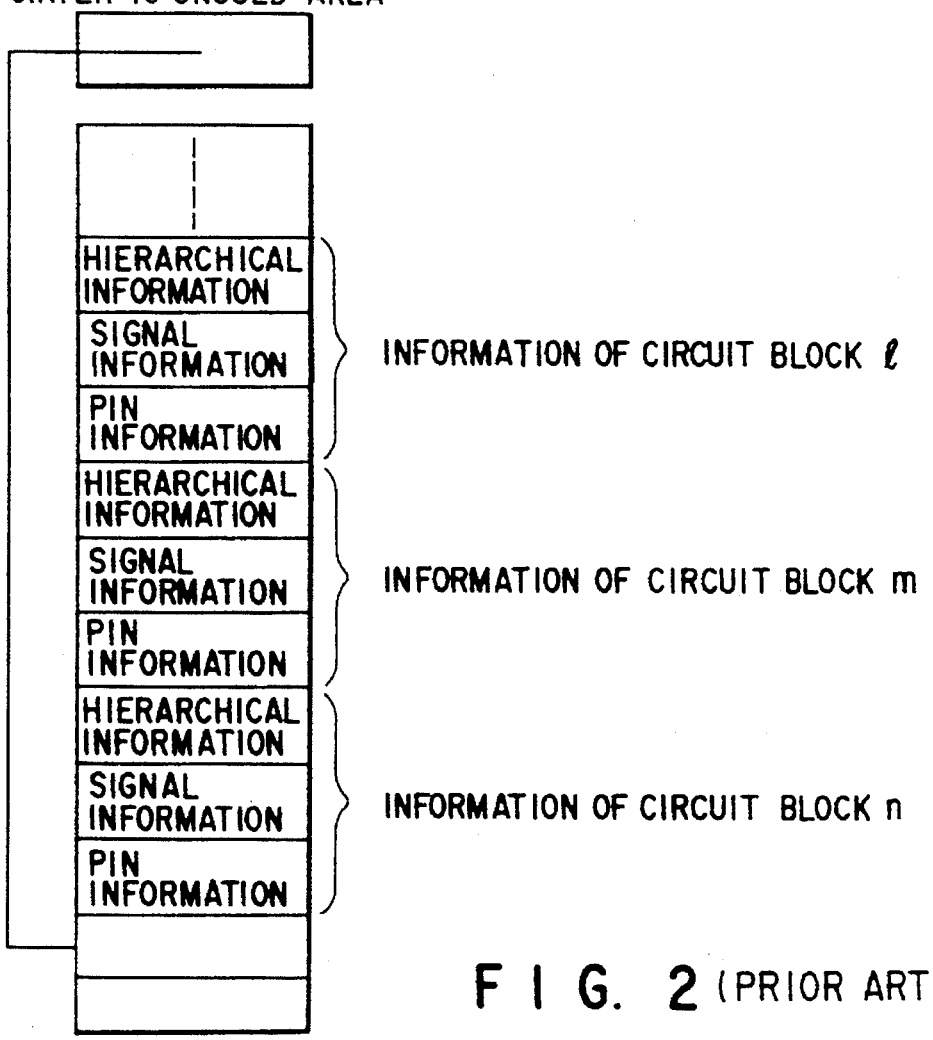
FIG. 2 is a view showing an arrangement of circuit information in the conventional logic simulation apparatus.

In the second embodiment, saving process can be executed by performing write system call twice in the procedure for saving check point information, and the loading process can be executed by performing a read system call twice in the procedure for loading the check point information. As described above, only the contents of the storing devices A2 and A4 whose contents are variable may be subjected to check point process. Therefore, as shown in FIG. 2, in the simulation, time required for saving and loading can be considerably shortened compared with a conventional simulation in which various data are arranged.

As a method of saving a circuit state by using check point, a method of calculating and saving the difference between the circuit state saved in advance and current circuit state is known. Since a process of calculating this difference in the second embodiment may be executed between selectively arranged data, saving process can be executed at a speed higher than that of conventional simulation. Although a large number of small differences may be obtained in the conventional simulation, relatively large differences can be easily obtained in the simulation of this embodiment. Therefore, increase in the size of the saving area can be expected.

The following method is known. That is, when a circuit state is to be saved, the amount of data which is actually saved is reduced by performing data compression, thereby shortening the time required for transferring data to be saved or reducing the size of the saving area. According to the second embodiment, since areas subjected to data compression are concentratedly assigned, the time required for the data compression is shorter than that of the conventional simulation.

In the second embodiment, the same effects as other effects described in the first embodiment can be obtained, as a matter of course.

As in the first embodiment, as the storing devices A1 to A4, four independent informations storing media or storing areas separately formed on one information storing medium B may be used. In addition, an intermediate scheme between these schemes, e.g., a scheme using information storing media C1 and C2, may be used to obtain the same effect as described in the first embodiment.

A logic simulation apparatus according to the third embodiment of the present invention will be described below.

Figure 23:
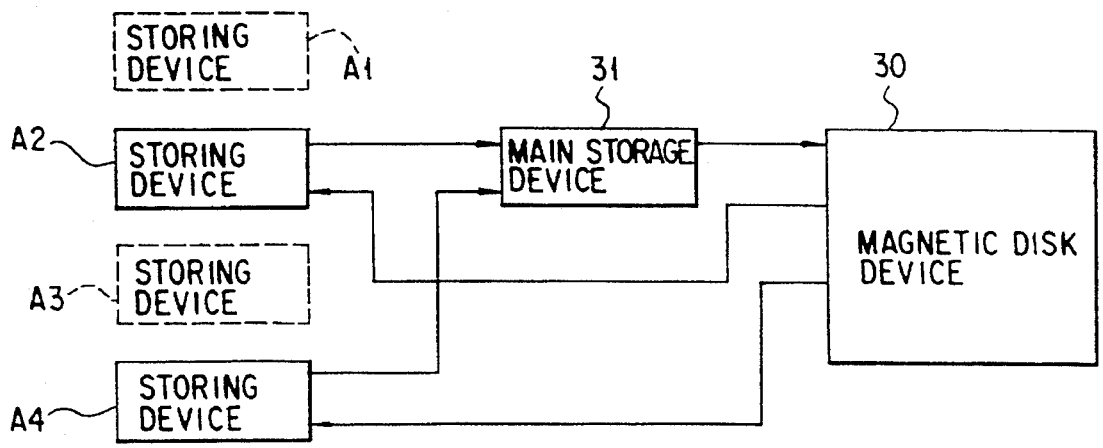
FIG. 23 is a diagram showing the third embodiment.

FIG. 23 shows storing devices A1 to A4, main storage device 31, and a magnetic disk device 30, all of which are connected in the logic simulation apparatus according to the third embodiment of the present invention. The logic simulation apparatus of the third embodiment schematically comprises the storing devices A1 to A3 for storing data related to a circuit subjected to the simulation, the storing device A4 for storing data related to events generated by the execution of simulation, the magnetic disk device 30 for saving the contents of the storing devices A2 and A4 by the check point process, the main storage device 31, an executing section (not shown) for executing other processes such as simulation, check point process, and page-in/page-out process, a display device (not shown), and an input device (not shown).

The kinds of data stored in the storing devices A1 to A4 are the same as those of the first embodiment described above, and data stored in the storing devices A2 and A4 are variables which change during the execution of simulation.

As the storing devices A1 to A4, four independent informations storing media, logical storing devices arranged on one or more information storing media as described above, or storing areas A1 to A4 may be used.

Figure 24:
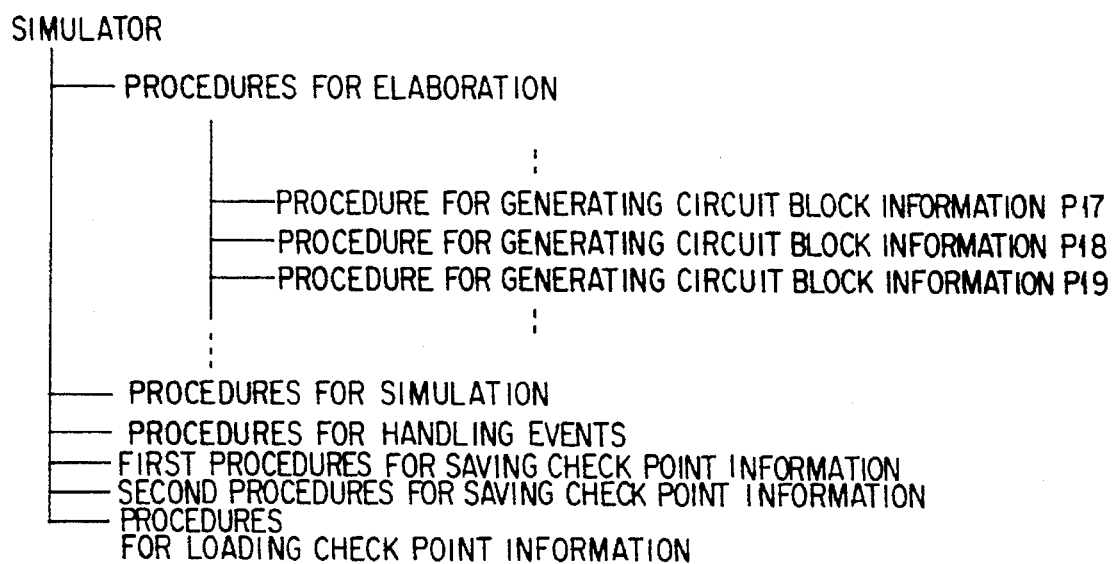
FIG. 24 is a chart showing main procedures related to the corresponding simulation executed by a logic simulation apparatus according to the third embodiment.

FIG. 24 shows main procedures (functions) executed by the logic simulation apparatus of the third embodiment. The procedures of the third embodiment include procedures for elaboration, procedures for simulation, procedures for handling events, the first procedure for saving check point information, the second procedure for saving check point information, and a procedure for loading check point information. The procedures for elaboration and the elaboration therefor are the same as those of the first embodiment, and a detailed description thereof will be omitted.

In the third embodiment, a saving work area w is formed in the main storage device 31 as storing means which can be accessed at a high speed. The size of the saving work area is set to be larger than the sum of the sizes of areas, which are in use, of the storing devices A2 and A4. As storing means which has a capacity larger than that of the main storage device 31 but cannot be accessed at a speed higher than that of the main storage device 31, the magnetic disk device 30 is used.

In the check point process, the simulation program calls the first procedure for saving check point information, and the contents of the areas, which are in use, of the storing devices A2 and A4 are transferred to the saving work area w on the main storage device 31. The simulation program starts the second procedure for saving check point information and then restarts the simulation. While the simulation program continuously executes the simulation, the second procedure for saving check point information saves data from the saving work area w onto the magnetic disk device 30 as a file area f.

Figures 25A, 25B:
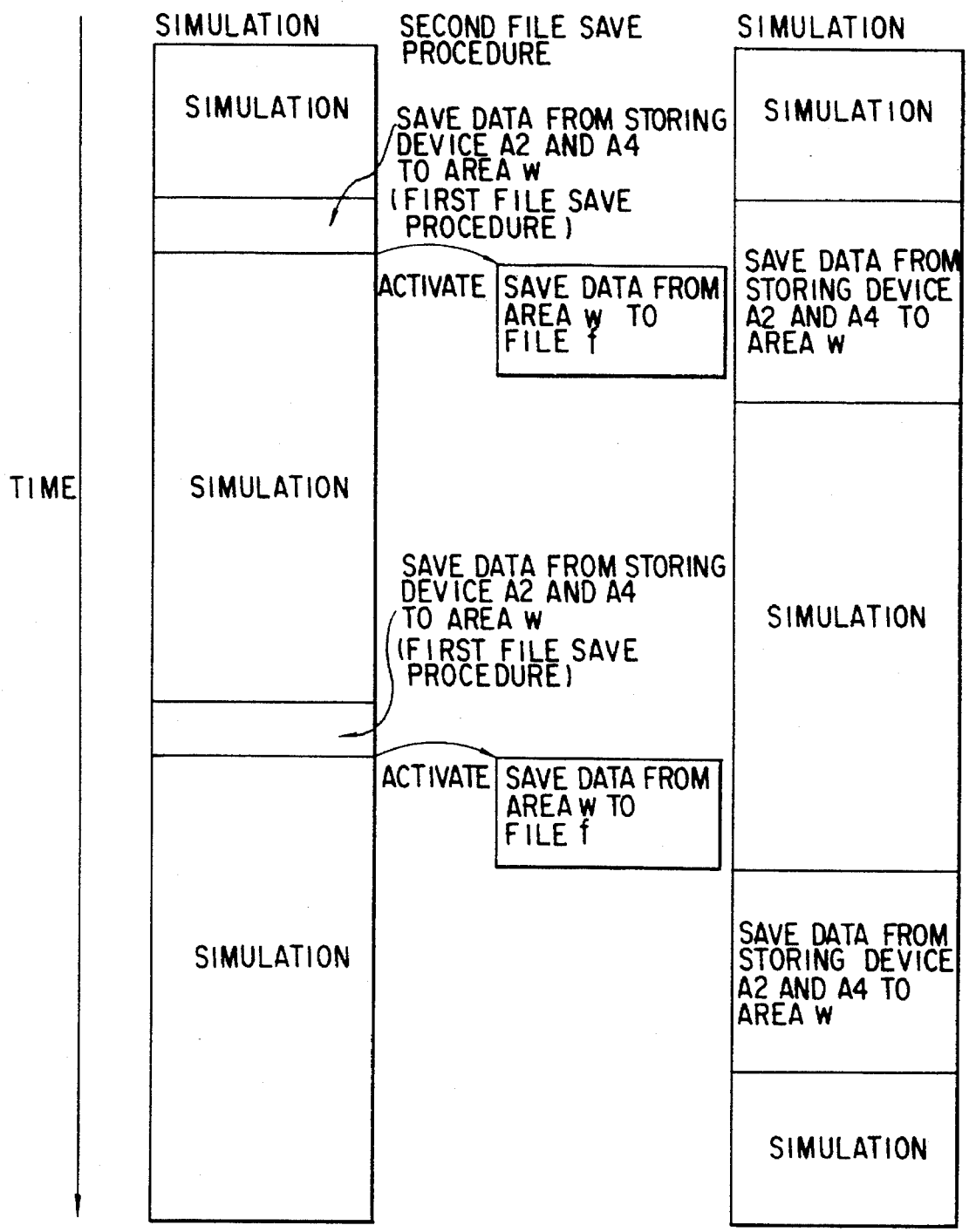
FIGS. 25A and 25B are views for explaining comparison between check point process of the logic simulation apparatus according to the second embodiment and check point process of the logic simulation apparatus according to the third embodiment.

FIGS. 25A and 25B are obtained by comparing the check point process of the third embodiment with the check point process of the second embodiment. FIG. 25A shows the flow of the process of the third embodiment, and FIG. 25B shows the flow of the process of the second embodiment. As is apparent from FIGS. 25A and 25B, according to the third embodiment, since the executing section can restart the simulation immediately after the first procedure for saving check point information is terminated, the simulation can be executed at a high speed.

In the third embodiment, a scheme of calculating the difference between the circuit state saved in advance and the current circuit state, or a scheme of performing data compression may be applied. In this case, in either of first and second saving means, these functions can be realized. However, the functions can be effectively performed in the second saving means because the number of times of interruption of the simulation by the check point process can be decreased.

In the third embodiment, the same effects as the other effects described in the first embodiment can be obtained, as a matter of course.

As in the first embodiment, as the storing devices A1 to A4, four independent informations storing media or storing areas separately formed on one information storing medium B may be used. In addition, an intermediate scheme between these schemes, e.g., a scheme using information storing media C1 and C2, may be used to obtain the same effect as described in the first embodiment.

In the third embodiment, although main storage device is used as storing means which can be accessed at a high speed, another information storing medium which can be accessed at a high speed may be used to obtain the same effect as described above.

In each of the first to third embodiments, an example wherein four different pieces of information are used has been described. However, an example wherein the number of kinds of pieces of information is not four can be applied to the present invention. That is, storing devices or areas whose number depends on the number of kinds of pieces of information may be arranged.

In each of the first to third embodiments, storing devices or areas are arranged for the kinds of pieces information, respectively. However, storing devices or areas need not be arranged for the kinds of pieces of information, but the storing devices or areas may be arranged for variable data and constant data, respectively.

The first to third embodiments have the following points. That is, pieces of information of the same type are continuously arranged in elaboration, and check point process and the second and subsequent page-out processes related to a page are executed such that only pieces of information which change during the execution of simulation are saved from the pieces of information of the same type which are continuously arranged. In addition, the third embodiment also has the following point. That is, saving process is executed in two steps, and, upon completion of the saving process of the first step, the simulation can be restarted. Therefore, the present invention can be applied to case wherein simulation is executed using software on a computer and to the case wherein simulation is executed using simulation hardware called hardware accelerator.

A logic simulation apparatus according to the fourth embodiment of the present invention will be described below.

FIG. 26 shows the schematic arrangement of logic simulation apparatus according to the fourth embodiment of the present invention. The logic simulation apparatus according to the fourth embodiment comprises a storing section 201, simulation executing section 202, simulation executing section 203 with interactive debugging function, an execution control section 204, a display section 205, and an input section 206 (e.g., a keyboard).

The storing section 201 is for storing the information of circuit subjected to the simulation. As pieces of circuit information stored in the storing section 201, as described in FIG. 27, structural information 234 of circuit and time wheel 233 for managing events generated during simulation are set. In addition, the storing section 201 has an execution state flag 231 indicating whether simulation is in execution, and a stop request flag 232 for requesting to stop simulation in execution. The execution state flag 231 holds "1" while simulation is in execution, and holds "0" while simulation is not in execution. The stop request flag 232 holds "1" when the stop is requested, and holds "0" when the stop is not requested.

The simulation executing section 202 includes a batch simulation program for executing simulation for circuit information stored in the storing section 201.

The simulation executing section 203 with interactive debugging function executes simulation of the circuit information stored in the storing section 201, and includes interactive debug simulation program performing interactive debugging function.

Simulation executed by the simulation executing section 202 is at a speed higher than that of simulation executed by the simulation executing section 203 with interactive debugging function. The simulation program is generated as follows. That is, function of the circuit described by, e.g., hardware description language VHDL, is converted into the programming language C, predetermined intermediate code, or the like, and the source code is compiled. In the following description, only trace function of various interactive debugging functions is used. However, one interactive debugging function or a plurality of interactive debugging functions may be used.

The execution control section 204 requests to stop or restart simulation executed by the simulation executing section 202 and the simulation executing section 203 with interactive debugging function.

Figure 29:
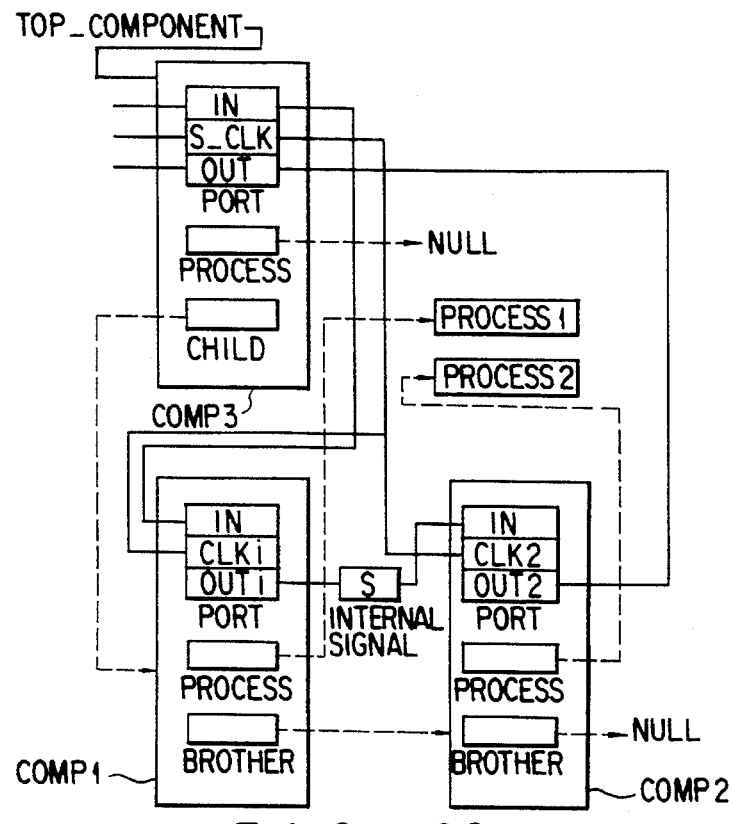
FIG. 29 is a view showing structural information of the circuit shown in FIG. 28.

A circuit subjected to simulation is shown in FIG. 28, and structural information corresponding to the circuit in FIG. 28 is shown in FIG. 29.

As shown in FIG. 28, upper-level circuit COMP3 is represented by using two lower-level circuits COMP1 and COMP2. As structural information of the upper-level circuit COMP3, as shown in FIG. 29, information of components constituting the circuit, hierarchical information representing parent-child relationship and brother relationship of these components, connection information representing a manner of connecting the components to each other, signal information used in connection, and link representing the process by which function of the component is defined are stored. For example, in order to trace the hierarchical structure of the components, the address of the highest-level component is found by "TOP_COMPONENT" in FIG. 29, one given lower-level component is found from the uppermost component by "Child", and components each having the same level as that of the given lower-level component are found by "Brother". When the above operation is repeated, the entire structure can be found. In addition, signals can be traced by components to which the signals belong.

Figure 30:
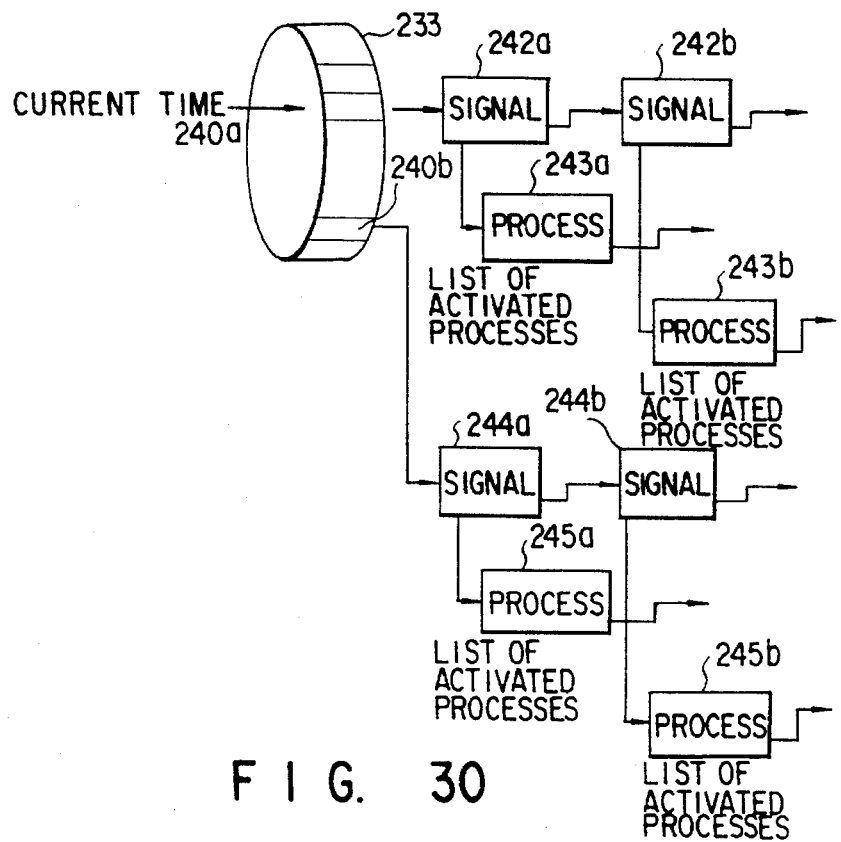
FIG. 30 is a view for explaining time wheel.

The time wheel 233, as shown in FIG. 30, classifies signal events in units of simulation times and holds them. Area for storing simulation time or simulation cycle exists. For example, at current time 240a, the following is registered. That is, signal events 242a and 242b and the like are generated, and processes 243a and 243b are activated in response to the events, respectively. At time 240b, registration related to events 244a and 244b and processes 245a and 245b are performed in the same manner as described above.

To access the storing section 201 from either program, the storing section 201 is allocated on the shared memory of the computer.

In order to make it possible to access the structural information 234 of the circuit stored in the storing section 201 and the time wheel 233, using a plurality of programs, not only the storing section 201 can be physically or logically accessed, but addresses at which pieces of information are respectively stored must be commonly determined in different programs. In the fourth embodiment, since the circuit information 234 or the time wheel 233 is constituted by connecting large number of small data structures to each other by pointers, it is satisfactory to know only the addresses of components corresponding to the entire circuit and the top address of the time wheel. Therefore, when these addresses are stored at the top of the shared memory, circuit information subjected to the simulation can be referred to from each program.

The process of the simulation executing section 202 will be described below with reference to FIG. 31.

The simulation executing section 202 waits for a command input from the execution control section 204 (step E1). As this command, a "circuit generation command" for generating the initial state of the circuit in the storing section 201 or a "simulation restart command" for executing the simulation for the circuit stored in the storing section 201 up to last time given as a parameter is input.

When the input command is the "circuit generation command" (step E2), the structural information and time wheel of the circuit in FIG. 27 are initialized (step E3), the stop request flag and execution state flag are initialized (step E4) and set to "0", and the flow returns to step E1.

If the input command is the "restart command" (step E2), the execution flag is set to "1" (step E5), signal event corresponding current simulation time are extracted from the time wheel, and signal assignment is executed (step E6). Upon completion of the signal assignment to be executed at the same time, processes are activated by the signal assignment (step E7). In the activated process, signal events are mainly generated, registered in the time wheel. When processes to be executed are absent, the simulation cycle is updated (step E8).

At the same time, if there exists some signal assignment at the time (step E9), the flow returns to step E6. Otherwise, the simulation time is updated (step E10).

If the simulation last time is reached (step E11), the execution state flag is set to "0" to stop the simulation (step E12). Otherwise, the flow returns to step E6, and the process for signal event corresponding new simulation time is performed.

The flow of the simulation executing section 203 with interactive debugging function is obtained by adding the following process to the above flow. That is, in step E6 as the signal assignment in the flow of the simulation executing section 202 in FIG. 31, it is checked whether the signal to which the assignment is performed is to be traced. If the signal is one to be traced, current simulation time and the assigned value are displayed. Other processes of the flow of the simulation executing section 203 with interactive debugging function are the same as those of the flow in FIG. 31.

Figure 32:
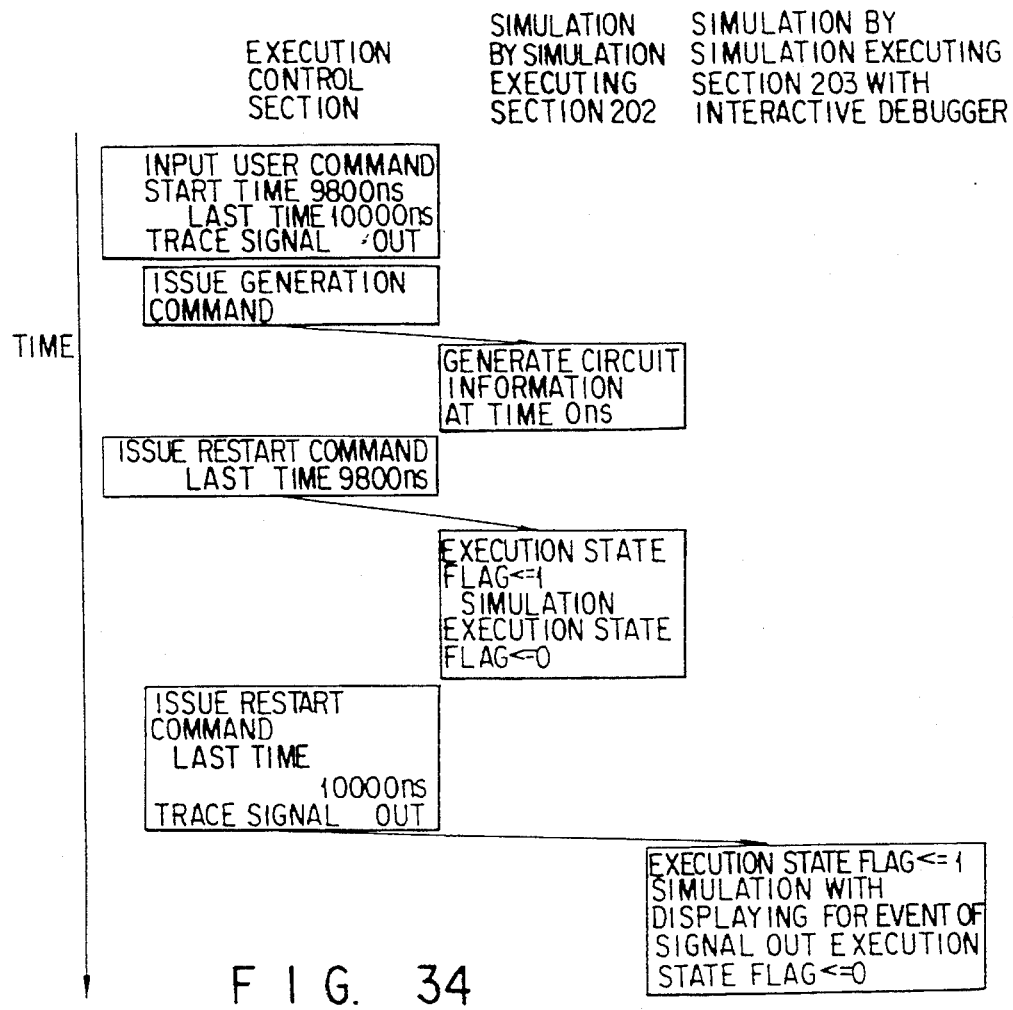
FIG. 32 is a view for explaining simulation restart command.

Therefore, a detailed description of the flow of the simulation executing section 203 with interactive debugging function will be omitted. The historical information as described above is called trace. Signals to be traced are given as the parameter of simulation restart command. The simulation restart command, as shown in FIG. 32, includes simulation last time and designation of signals to be traced. Therefore, although simulation speed of the simulation executing section 203 with interactive debugging function is lower than that of the simulation executing section 202, user can see change in signal value during simulation.

Figure 33:
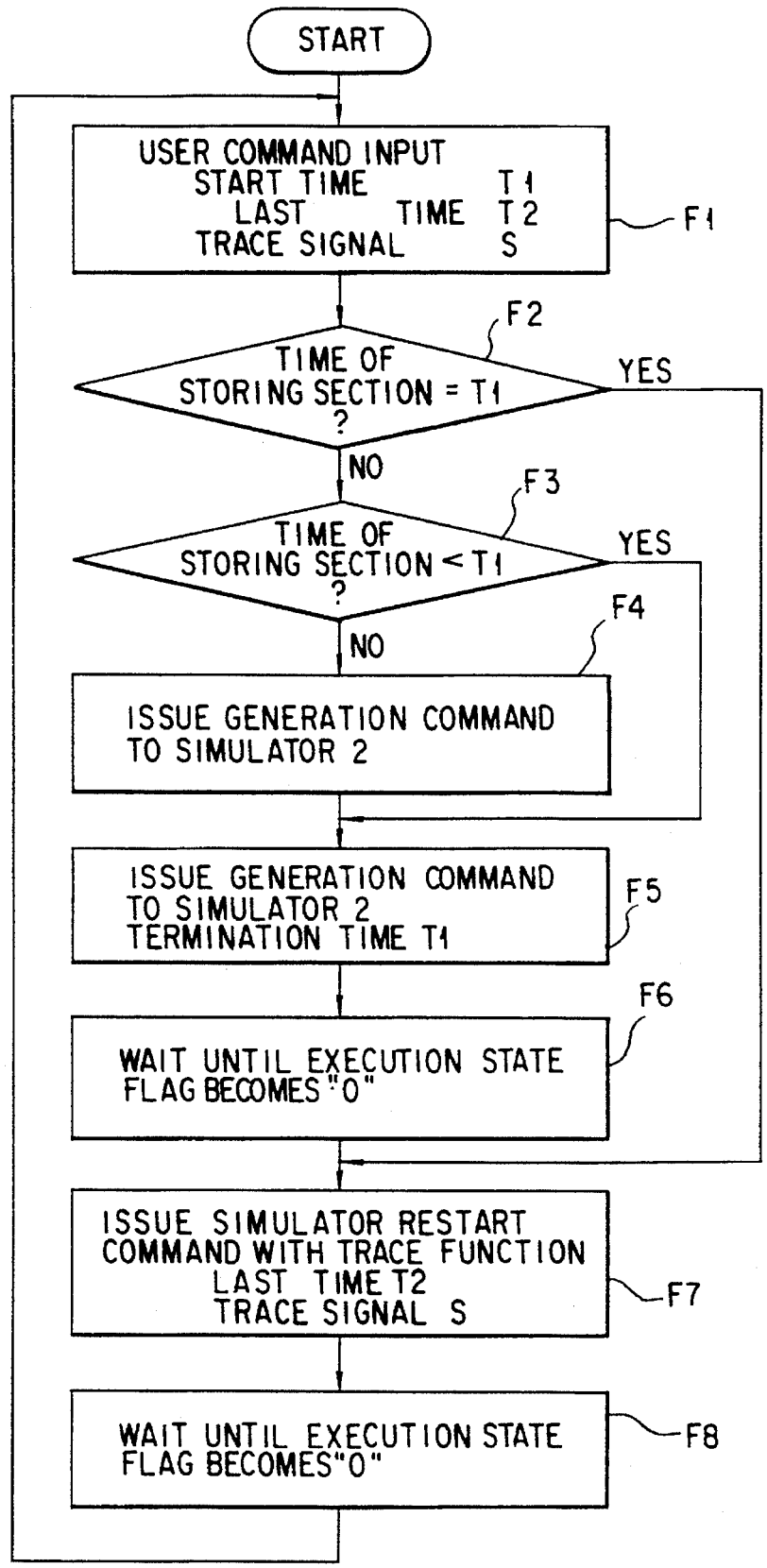
FIG. 33 is a flow chart showing the flow of the execution control section in FIG. 26.

FIG. 33 shows flow executed when the execution control section 204 receives a request of simulation with trace function by user.

When the execution control section 204 receives start time T1 and last time T2 of the simulation from the input section 206 (step F1), the execution control section 204 checks whether simulation time stored in the storing section 201 coincides with time T1 (step F2).

If YES in step F2, the execution control section 204 instructs the simulation executing section 203 with interactive debugging function to restart simulation (step F7). The simulation executing section 203 with interactive debugging function restarts simulation with trace function using data stored in the storing section 201.

If NO in step F2, it is checked whether the simulation time <T1 (step F3).

If YES in step F3, the simulation executing section 202 is instructed to restart simulation from current time to last time T1 (step F5).

If NO in step F3 (i.e., time >=T1), since data which can be used to restart simulation in the middle of the simulation is not present, a circuit generation command is issued to the simulation executing section 202 (step F4), and the circuit state at simulation time 0 ns is generated to the storing section 201. A simulation restart command is issued to the simulation executing section 202 (step F5), and the circuit state at time T1 is generated to the storing section 201. When the execution state flag becomes "0" (step F6), the simulation executing section 203 with interactive debugging function issues a simulator restart command with trace function last time T2 (step F7).

When the execution state flag becomes "0" (step F8), the flow returns to step F1.

The operation of the logic simulation apparatus according to the fourth embodiment will be described below with reference to FIG. 34. In this case, since it was found that, when the simulation was executed up to 10,000 ns, the value of the output signal OUT was different from the expected value, a case wherein the value of the output signal OUT is traced from 9,800 ns will be described below as an example.

The user requests the execution control section 204 to execute simulation from time 9,800 ns to time 10,000 ns while tracing the output signal OUT. Since simulation time value stored in the storing section 201 is not less than the value of time 10,000 ns, the execution control section 204 sends a circuit generation command to the simulation executing section 202 in accordance with step F4 in FIG. 33 to generate the initial state (time 0 ns) of the circuit.

The execution control section 204 sends simulation restart command whose last time is 9,800 ns to the simulation executing section 202 in accordance with step F5.

Figure 31:
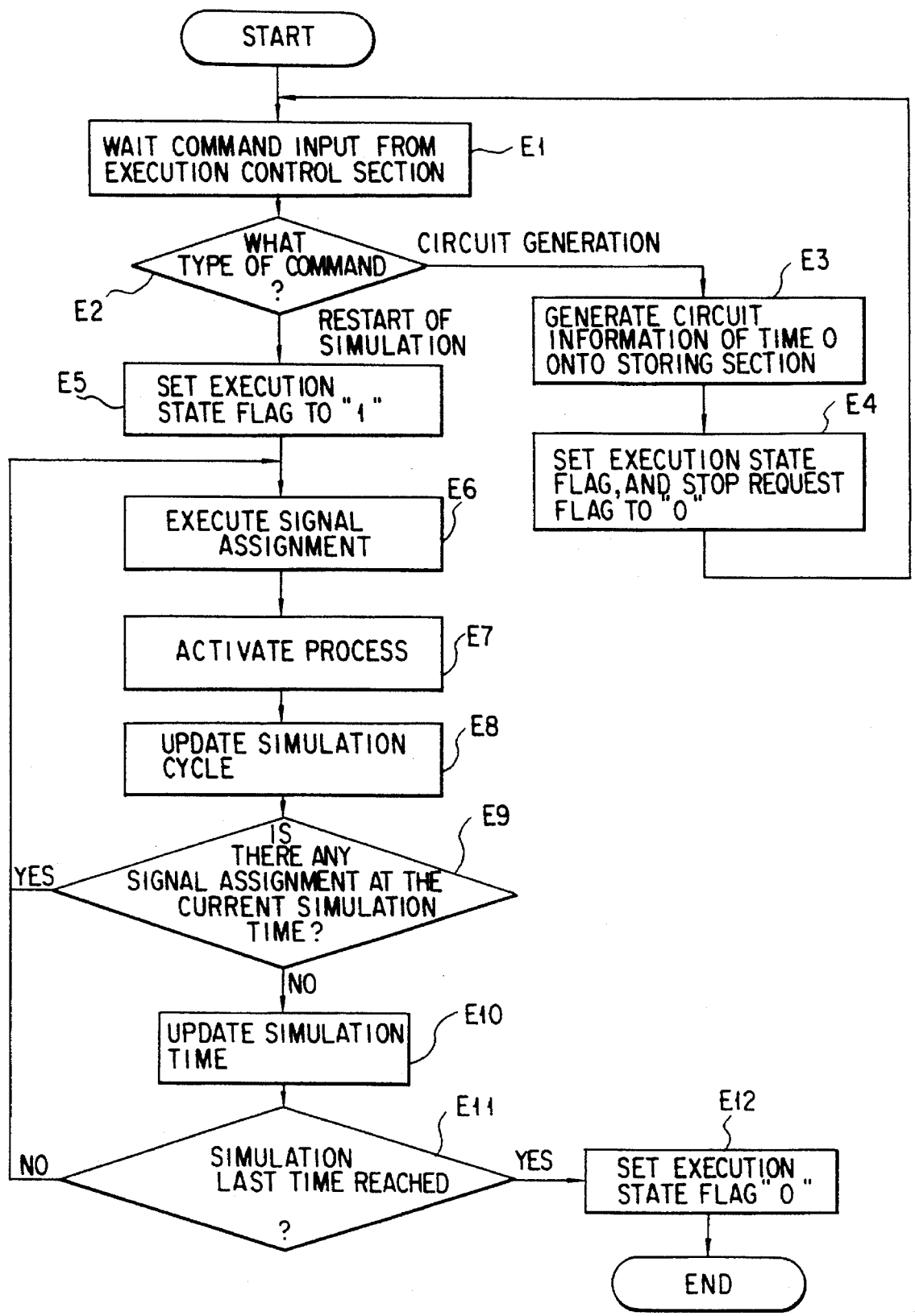
FIG. 31 is a flow chart showing the flow of the simulation executing section in FIG. 26.

The simulation executing section 202 executes a simulation in accordance with the flow in FIG. 31. When the simulation time reaches 9,800 ns, the simulation executing section 202 checks in step E11 whether the last time is reached, and changes the execution state flag to "0" to terminate the simulation.

The execution control section 204, in step F6 in FIG. 33, waits until the simulation executing section 202 terminates its operation. The execution control section 204 sends simulation restart command, which instructs the simulation executing section 203 with interactive debugging function to trace the output signal OUT, to the simulation executing section 203 with interactive debugging function at simulation last time 10,000 ns.

When the simulation executing section 203 with interactive debugging function receives simulation restart signal, the simulation executing section 203 with interactive debugging function, in accordance with the flow in FIG. 31, restarts the simulation from the process of signal assignment to be performed at present time 9,800 ns (step E6). Simulation time and the signal value are displayed each time a assignment occurs in the output signal OUT. When the time has reached 10,000 ns, it is checked in step E11 whether simulation last time is reached, and the execution state flag is set to "0", thereby terminating the simulation.

The execution control section 204 waits until the simulation executing section 203 terminates its operation in step F8 of FIG. 33, and then waits for a command input from the user.

As described above, according to the fourth embodiment, simulation is executed at a high speed by a batch simulator with no interactive debugging function up to debug start time, and the batch simulator is switched to a simulator with interactive debugging function at debug start time. Since this switching is automatically performed with the user being kept unrecognized and without sending a file, the logic simulation apparatus of the fourth embodiment can quickly start debugging from the debug start time compared with a conventional logic simulation apparatus. In other words, the same effect as that obtained by increasing the speed of conventional simulation with interactive debugging function can be provided.

In the fourth embodiment, the first simulation program is used as a simulator with interactive debugging function, and the second simulation program is used as a program which executes simulation at a speed higher than that of the first simulation program. However, the following simulation programs may be used.

The first simulation program may be interpreter simulator, and the second simulation program may be a compiled simulator.

The first simulation program may be a compiled simulator with line debug function of functional specifications, and the second simulation program may be a compiled simulator with no line debug function of functional specifications.

The first simulation program is a simulator which can be stopped in even simulation cycle within simulation time, and the second simulation program may be a simulator which can be stopped only when time is updated.

The first simulation program may be a simulator having of which can check the activation functional specification description and the second simulation program may be a simulator having no function included in said first simulation program.

The first simulator may include at least one direct compiled simulator.

A logic simulation apparatus according to the fifth embodiment of the present invention will be described below.

FIG. 35 shows the schematic arrangement of a logic simulation apparatus of the fifth embodiment. The logic simulation apparatus of the fifth embodiment comprises, a storing section 201, a first simulation executing section 212, the second simulation executing section 217, an execution control section 214, a display section 205, and an input section 206.

The first simulation executing section 212 and the second simulation executing section 217 include simulation programs for executing simulations for circuit information stored in the storing section 201, respectively. According to the fifth embodiment, it is assumed that the simulation executed by the second simulation executing section 217 is executed at a speed higher than that of simulation executed by the first simulation executing section 212. In addition, although the simulation executed by the first simulation executing section 212 is inferior to the simulation executed by the second simulation executing section 217 in simulation speed, it is assumed that a preparation time (i.e., mainly a compiling time) required for activating the simulation executed by the first simulation executing section 212 is shorter than that of the simulation executed by the second simulation executing section 217.

Hardware description language processing system has the following three roles. That is, source code of the simulation is generated from the hardware description. The generated source code is compiled without optimization to form simulation program of the first simulation executing section 212. The source code is compiled with optimization to form simulation program of the second simulation executing section 217. The technique of parallelly executing the programs having the above execution forms by a plurality of computers connected to each other on a network has been established and is called "parallel make"

The flow of the execution control section 214 in the fifth embodiment is shown in FIG. 36. This flow shows the operation performed when simulation from time 0 ns to time T is requested by the user.

When time T is input from the input section 206 by the user (step G1), the execution control section 214 waits until an executable simulator is generated (step G2). The simulation executing sections 212 and 217 start compiling for making the simulation program executable by the instruction from the execution control section 214.

When an executable simulation program is generated, a circuit generating command is issued to the simulation executing section (in this case, the first simulation executing section 212) including this simulation program, and the circuit generating command issued to the fastest simulator (step G3).

A faster simulation program is selected from the simulation programs which can be executed at present, and simulation restart command is issued to the faster simulator (in this case, the first simulation executing section 212) including the corresponding simulation program, thereby instructing the simulation executing section to execute the simulation up to last time T (step G4).

The execution control section 214 refers to the execution state flag every other second to check whether the simulation is terminated (steps G5 to G7). If the simulation is terminated, the flow returns to a state in which the execution control section 214 waits for a command input from the user (step G1). Otherwise, the execution control section 214 checks whether a simulator faster than the simulation program which is in execution at present is executable (step G7). If YES in step G7, the stop request flag is set to "1" to request the simulation executing section (in this case, the first simulation executing section 212) related to the simulation which is in execution at present to stop the corresponding simulation (step G8).

The execution control section 214 waits until the execution sate flag becomes "0" (step G9). If time does not reach last time (step G10), the flow returns to step G4. The execution control section 214 causes the simulation executing section (in this case, the second simulation executing section 217) including the fastest simulation program at this time to continue the simulation (steps G5 to G7).

In the fifth embodiment, a description has been made using the two simulation executing sections 212 and 217 respectively including simulation programs having different compiling times and different simulation speeds. However, three or more simulation executing sections may be arranged. In this case, it is detected in step G7 whether a faster simulation program is generated, and the simulation may be executed such that simulation program is switched to a faster simulation program each time the faster simulation program is generated.

Means used in steps G2 and G7 of FIG. 36 to detect that an executable simulation program is generated may be arranged as follows. That is, flags each indicating that simulation program is generated are arranged in the storing section 201 or the like in units of simulation programs. For example, when a compiler generates simulation program, a flag indicating that the corresponding program is generated may be asserted, and the execution control section 214 may monitor these flags. This means can also be constituted such that the execution control section 214 monitors the presence of the predetermined file generated in accordance with generation of the simulation program.

Means for selecting the fastest simulator when there are a plurality of executable simulators used in step G7 of FIG. 36 may be constituted as follows. That is, the target table in which the names of the simulation programs and data related to simulation speeds of the simulation programs is formed in the storing section 201, the simulation speed of the executable simulation program which is newly detected is compared with the simulation speed of simulation program which has been made executable, with reference to the target table, thereby selecting the fastest simulator. As the data related to the simulation speeds of the simulators and stored in the target table, the evaluation values of uniformly given simulation speeds may be used. In addition, when the nature of a compiler used for generating simulation program is known, pieces of information such as the iteration number of for-loop operations in the remaining simulation programs may be used as concrete index values. Moreover, the fastest simulator may be selected using a predetermined evaluation function on the basis of these evaluation values or index values.

The operation of the fifth embodiment performed when the simulation is executed up to time 10,000 ns after the hardware description is changed will be described below.

When the hardware description is changed, as shown in FIG. 37, the processing system of the hardware description language generates a C language source code of corresponding to new hardware on the basis of the changed contents. The generated source code is compiled in both modes, e.g., one of which has optimization and the other of which has no optimization. These two compilings can be performed efficiently using sources connected to a network, using a plurality of usable computers, or a multiprocessing computer.

The execution control section 214 receives a request from the user to execute simulation up to time 10,000 ns (step G1 in FIG. 36), and the execution control section 214 waits until any one of the simulation programs of the simulation executing sections 212 and 217 is compiled (step G2).

As shown in FIG. 37, when the simulation program of the first simulation executing section 212 is compiled first, the execution control section 214 sends a circuit generating command to the first simulation executing section 212 to generate circuit information subjected to the simulation (step G3).

Upon completion of these operations, the execution control section 214 sends simulation restart command (last time 10,000 ns) to the simulation executing section including the fastest simulation program of simulation programs which can be used at this time. FIG. 37 shows a case wherein the simulator is compiling with optimization. For this reason, the restart command is sent to the first simulation executing section 212.

Thereafter, upon completion of the compiling of the second simulation executing section 217, the execution control section 214 sets the simulation stop request flag to "1" (step G8). The first simulation executing section 212 sets both execution state flags to "0" in FIG. 38 to terminate the simulation.

The execution control section 214 waits until the execution state flag becomes "0" (step G9). The flow returns to step G4, and the execution control section 214 sends simulation restart command (last time 10,000 ns) to the second simulation executing section 217.

The second simulation executing section 217, as in the simulator with interaction debugging function in the fourth embodiment, starts simulation in accordance with the flow of FIG. 38. The flow in FIG. 38 is obtained by inserting steps E13 and E14 for setting the stop request flag to "0" when the stop request flag is "1" into the flow in FIG. 31. Since the remaining arrangement of the flow in FIG. 38 is the same as that in FIG. 31, a detailed description thereof will be omitted.

As has been described above, according to the present invention, simulation is started by the given simulation executing section under the control of the execution control section. When a faster simulation program of the other simulation executing section is made executable, the given executing section is switched to the other simulation executing section, thereby executing the remaining simulation. Since this switching is automatically performed with user being kept unrecognized and without sending a file, and is executed at a high speed. Therefore, simulation can be executed at a speed higher than that of one executed such that simulation program is manually switched to another with a file. Naturally, in this case, simulation can be executed at a speed higher than that executed by using any one of simulation executing sections.

The operation of a logic simulation apparatus according to this embodiment can be performed using a plurality of usable computers or a multiprocessing computer. Since simulation executed by one of the simulation executing sections is stopped when a faster simulation executing section of the other simulation executing section is made executable, hardware resources can be more effectively utilized in this case than in a case wherein the simulations are independently, parallelly executed by these simulation programs using the plurality of computers or the multiprocessing computer.

In the fourth embodiment, until restart time T1 is reached, simulations can also be executed such that simulation executing section is switched to faster simulation executing sections which are sequentially generated.

A logic simulation apparatus according to the sixth embodiment of the present invention will be described below.

FIG. 39 shows the schematic arrangement of the logic simulation apparatus according to the sixth embodiment of the present invention. The logic simulation apparatus according to the sixth embodiment comprises a storing section 201, simulation executing section 222, a brawzer section 228, an execution control section 224, a display section 205, and an input section 206.

The simulation executing section 222 has simulation program for executing simulation to circuit information stored in the storing section 201. The brawzer section 228 includes programs for periodically displaying simulation time stored in the storing section 201, displaying the value of signals in the circuit subjected to the simulation, or changing the value on the basis of a user's instruction. The brawzer section 228 is effective to verify the operation of the circuit.

Since the display program or the like of the brawzer section 228 can directly access the storing section 201, data requested by the user can be displayed or changed at a high speed compared with a case wherein a conventional method using file transfer is used. In particular, in a multiprocessor system, since the simulation executing section 222 and the brawzer section 228 can be operated by different processors, the simulation speed of the simulation executing section 222 is not degraded. In addition, function of operating a circuit subjected to the simulation can be advantageously added/ changed without changing the simulation executing section 222. In particular, this is effective when commercially available simulation program is used as the simulation program of the simulation executing section 222. Moreover, the program size of the simulators decreases, and simulation can be executed by a computer having a smaller memory.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A logic simulation apparatus for executing simulation of a circuit function on the basis of information related to a circuit subjected to the simulation, using at least a first simulation program and a second simulation program executed at a speed higher than that of said first simulation program, the simulation apparatus comprising:

storing means for storing data shared by said first and second simulation programs;

simulation executing means for executing simulation using any one of said first and second simulation programs;

specifying means for specifying timing on simulation to be switched to simulation using said first simulation program executed by said simulation executing means;

start control means for starting simulation using said second simulation program;

stop control means for interrupting the simulation executed by said simulation executing means at the specified timing; and restart control means for causing, in response to interruption of the simulation by said stop control means, said simulation executing means to restart the simulation using said first simulation program from the specific timing.

2. An apparatus according to claim 1, wherein said first simulation program is an interpreter simulator, and said second simulation program is a compiled simulator.

3. An apparatus according to claim 1, wherein said first simulation program is a compiled simulator with a line debugging function of the functional specifications; and said second simulation program is a compiled simulator with no line debugging function of the functional specifications.

4. An apparatus according to claim 1, wherein said first simulation program is a simulator which can be stopped in simulation cycle within simulation time, and said second simulation program is a simulator which can be stopped only when time is updated.

5. An apparatus according to claim 1, wherein said first simulation program is a delay mode simulator which accurately evaluates delay, and said second simulation program is a high-speed simulator in which delay is omitted.

6. An apparatus according to claim 5, wherein said second simulation program is a cycle base simulator for evaluating operations between clocks by one cycle.

7. An apparatus according to claim 1, wherein said first simulation program is a simulator which can check activation functional specification description; and said second simulation program is a simulator having no function included in said first simulation program.

8. A logic simulation apparatus for executing simulation of a circuit function on the basis of information related to a circuit subjected to the simulation, using one program selected from at least two simulation programs having different simulation speeds and different compiling times, the simulation apparatus comprising:

at least two simulation executing means for compiling and then executing one of said simulation programs said at least two simulation executing means using different simulation programs;

first start control means for causing said at least two simulation executing means to start compiling;

detecting means for detecting said simulation executing means having completed the compiling;

second start control means for causing said simulation executing means, detected by said detecting means for the first time, to start simulation using an executable simulation program of said detected simulation executing means;

evaluation selecting means for evaluating whether said simulation executing means, newly detected by said detecting means, can execute simulation at a speed higher than that of said simulation executing means, executing simulation at this time, and selecting said newly detected simulation executing means when it is evaluated that said newly detected simulation executing means can execute simulation at a speed higher than that of said simulation executing means executing simulation at this time;

stop control means for causing said simulation executing means, executing the simulation to interrupt the simulation being executed, when said newly detected simulation executing means is selected by said evaluation selecting means; and restart means for, in response to interruption of the simulation by said stop control means, restarting the simulation using an executable simulation program of said newly selected simulation executing means from the same time at which the simulation is interrupted.

9. An apparatus according to claim 8, wherein said evaluation selecting means includes means for generating a target table of identifiers of simulation programs and data related to simulation speeds of said simulation programs; and means for comparing, using said target table, the simulation speed of a newly detected executable simulation program with the simulation speed of another simulation program which has been made executable.

10. An apparatus according to claim 8, wherein said simulation executing means includes at least one interpreter simulator and at least one compiled simulator.

11. An apparatus according to claim 8, wherein said simulation executing means includes at least one direct compiled simulator.

12. An apparatus according to claim 8, further comprising brawzer means, having at least one display program, for displaying predetermined information during the simulation.

13. An apparatus according to claim 12, wherein said brawzer means further includes means for changing said predetermined information on the basis of request of user.

14. A logic simulation apparatus according to claim 1, wherein said first simulation program has debugging function and said second simulation program has no debugging function.

* * * * *